(12) United States Patent
Dai

(10) Patent No.: US 9,570,028 B2
(45) Date of Patent: Feb. 14, 2017

(54) PMOS GATE DRIVING CIRCUIT

(71) Applicant: Shenzhen China Star Optoelectronics Technology Co., Ltd., Shenzhen (CN)

(72) Inventor: Chao Dai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 8 days.

(21) Appl. No.: 14/761,301

(22) PCT Filed: May 13, 2015

(86) PCT No.: PCT/CN2015/078825
§ 371 (c)(1),
(2) Date: Jul. 15, 2015

(87) PCT Pub. No.: WO2016/149994
PCT Pub. Date: Sep. 29, 2016

(65) Prior Publication Data
US 2016/0307532 A1 Oct. 20, 2016

(30) Foreign Application Priority Data
Mar. 24, 2015 (CN) .......................... 2015 1 0131632

(51) Int. Cl.
*G09G 3/36* (2006.01)
*H01L 27/12* (2006.01)

(52) U.S. Cl.
CPC .............. *G09G 3/3677* (2013.01); *G09G 3/36* (2013.01); *H01L 27/124* (2013.01); *G09G 2310/06* (2013.01); *G09G 2310/08* (2013.01)

(58) Field of Classification Search
CPC .. G09G 3/3677; G09G 3/3696; G09G 3/3648; G09G 2300/0408; G09G 2300/0417; G09G 2300/0478; G09G 2300/0426; G09G 2310/0243; G09G 2310/0286; G09G 2310/0289; G11C 19/00

See application file for complete search history.

(56) References Cited

U.S. PATENT DOCUMENTS

| | | | |
|---|---|---|---|
| 2007/0171115 A1* | 7/2007 | Kim ..................... | G09G 3/3677 341/155 |
| 2014/0086379 A1* | 3/2014 | Ma ......................... | G11C 19/28 377/64 |
| 2016/0064098 A1* | 3/2016 | Han ....................... | G11C 19/28 345/211 |

FOREIGN PATENT DOCUMENTS

CN 104064159 A 9/2014

* cited by examiner

*Primary Examiner* — Kent Chang
*Assistant Examiner* — Andrew Lee
(74) *Attorney, Agent, or Firm* — Leong C. Lei

(57) ABSTRACT

The present invention provides a PMOS gate driving circuit, comprising a plurality of GOA unit circuits which are cascade connected, and the GOA unit circuit of every stage comprises a pull-up controlling module (100), a pull-up module (200), a transmission module (300), a first pull-down module (400), a bootstrap capacitor (500) and a pull-down holding module (600); the pull-up controlling module (100) receives a constant negative voltage level (VSS1), which can reduce the influence of PMOS element leakage to the first node (Q(N)); the pull-down holding module (600) is provided with a dual inverter (F1) comprising P-type thin film transistors, and utilizes special leakage prevention design, which can reduce the leakage of the first node (Q(N)) to prevent the influence of the electrical property of the depletion-mode P-type thin film transistors to the output of the inverter, raise the stability of the gate driving circuit, and promote the integration of the panel. The frame (Continued)

width of the liquid crystal display panel can be decreased in advance, particularly to be suitable for small size panel which requires higher demands to the frame width.

14 Claims, 15 Drawing Sheets

PMOS GATE DRIVING CIRCUIT

FIELD OF THE INVENTION

The present invention relates to a liquid crystal display driving field, and more particularly to a PMOS gate driving circuit.

BACKGROUND OF THE INVENTION

The Liquid Crystal Display (LCD) possesses advantages of thin body, power saving and no radiation to be widely used in many application scope. Such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate thereof is coupled to a level scan line, and the drain is coupled to a vertical data line, and the source is coupled to the pixel electrode. The enough voltage is applied to the level scan line, and all the TFTs electrically coupled to the scan line are activated. Thus, the signal voltage on the data line can be written into the pixel to control the transmittances of different liquid crystals to achieve the effect of controlling colors. The driving of the level scan line in the present active liquid crystal display is mainly accomplished by the external Integrated Circuit (IC). The external IC can control the charge and discharge stage by stage of the level scan lines of respective stages. The GOA (Gate Driver on Array) technology, i.e. the array substrate row driving technology can utilize the array manufacture process of the liquid crystal display panel to manufacture the gate driving circuit on the TFT array substrate for realizing the driving way of scanning the gates row by row. The GOA technology can reduce the bonding procedure of the external IC and has potential to raise the productivity and lower the production cost. Meanwhile, it can make the liquid crystal display panel more suitable to the narrow frame or non frame design of display products.

Generally, the Low Temperature Poly-silicon (LTPS) semiconductor thin film transistors can be categorized into two types: one is N-type element (NMOS) which mainly conducts with the electrons, and the other is P-type element (PMOS) which mainly conducts with the holes. A general CMOS refers to a complementary element utilizing the NMOS and the PMOS together. Under circumstances of some special applications and process condition restrictions, the liquid crystal display requires selecting the PMOS only element to be the thin film transistor of the gate driving circuit. Consequently, there is a need to design the integrated gate driving circuit for the PMOS only element to improve the performance of the gate driving circuit to promote the integration of the panel and decrease the frame width of the liquid crystal display panel in advance.

SUMMARY OF THE INVENTION

An objective of the present invention is to provide a PMOS gate driving circuit, which can reduce leakage, raise the stability of the gate driving circuit and promote the integration of the panel. The frame width of the liquid crystal display panel can be decreased in advance, more particularly to be suitable for small size panel which requires higher demands to the frame width.

For realizing the aforesaid objective, the present invention provides a PMOS gate driving circuit, comprising a plurality of GOA unit circuits which are cascade connected, and the GOA unit circuit of every stage comprises a pull-up controlling module, a pull-up module, a transmission module, a first pull-down module, a bootstrap capacitor and a pull-down holding module;

N is set to be a positive integer, and in the GOA unit circuit of the Nth stage:

the pull-up controlling module is electrically coupled to a first node and the pull-down holding module; the pull-up controlling module at least comprises a P type thin film transistor, and at least receives a stage transfer signal of the GOA unit circuit of the former N−1th stage and a constant negative voltage level;

the pull-up module comprises: a twenty-second P-type thin film transistor, and a gate of the twenty-second P-type thin film transistor is electrically coupled to the first node, and a source is electrically coupled to an Mth clock signal, and a drain is electrically coupled to a scan driving signal;

the transmission module comprises: a twenty-first P-type thin film transistor, and a gate of the twenty-first P-type thin film transistor is electrically coupled to the first node, and a source is electrically coupled to the Mth clock signal, and a drain is electrically coupled to the stage transfer signal;

the first pull-down module is electrically coupled to the first node and the scan driving signal, and comprises a fortieth P-type thin film transistor and a forty-first P-type thin film transistor which are mutually cascade connected, and employed to pull up a voltage level of the first node to a voltage level of the scan driving signal in a non-functioning period;

one end of the bootstrap capacitor is electrically coupled to the first node, and the other end is electrically coupled to the scan driving signal;

the pull-down holding module comprises: an inverter comprising a plurality of P-type thin film transistor, and an input end of the inverter is electrically coupled to the first node, and an output end is electrically coupled to a second node; a thirty-second P-type thin film transistor, and a gate of the thirty-second P-type thin film transistor is electrically coupled to the second node, and a source is electrically coupled to a drain of the forty-first P-type thin film transistor, and a drain is electrically coupled to a first constant positive voltage level; a forty-second P-type thin film transistor, and a gate of the forty-second P-type thin film transistor is electrically coupled to the second node, and a drain is electrically coupled to the first node, and a source is electrically coupled to a drain of an eighty-second P-type thin film transistor; the eighty-second P-type thin film transistor, and a gate of the eighty-second P-type thin film transistor is electrically coupled to the first node, and a source is electrically coupled to the constant negative voltage level, and the drain is electrically coupled to a drain of an eighty-first P-type thin film transistor; the eighty-first P-type thin film transistor, and a gate of the eighty-first P-type thin film transistor is electrically couple to the second node, and a source is electrically couple to a second constant positive voltage level, and the drain is electrically couple to the drain of the eighty-second P-type thin film transistor;

the first constant positive voltage level is lower than the second constant positive voltage level.

The pull-up controlling module comprises one P-type thin film transistor: an eleventh P-type thin film transistor, and a gate of the eleventh P-type thin film transistor receives the stage transfer signal of the GOA unit circuit of the former N−1th stage, and a source receives the constant negative voltage level, and a drain is electrically coupled to the first node.

The pull-up controlling module comprises three P-type thin film transistors: an eleventh P-type thin film transistor, a twelfth P-type thin film transistor and a thirteenth P-type thin film transistor; both a gate and a source of the eleventh P-type thin film transistor receive the stage transfer signal of the GOA unit circuit of the former N−1th stage, and a drain is electrically coupled to a source of the twelfth P-type thin film transistor and a drain of the thirteenth P-type thin film transistor; a gate of the twelfth P-type thin film transistor receives the stage transfer signal of the GOA unit circuit of the former N−1th stage, and the source is electrically coupled to the drain of the eleventh P-type thin film transistor, and a drain is electrically coupled to the first node; a gate of the thirteenth P-type thin film transistor receives the scan driving signal, and a source receives the constant negative voltage level, and the drain is electrically coupled to the drain of the eleventh P-type thin film transistor.

A gate of the fortieth P-type thin film transistor is electrically coupled to a stage transfer signal of the GOA unit circuit of the next second N+2th stage or a scan driving signal of the next second N+2th stage, and a source is electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

A gate of the fortieth P-type thin film transistor is electrically coupled to an M+2th clock signal, and a source is electrically coupled to the first node, and a drain is electrically coupled to a source of the forty-first P-type thin film transistor; a gate of the forty-first P-type thin film transistor is electrically coupled to a stage transfer signal of the GOA unit circuit of the next second N+2th stage or a scan driving signal of the next second N+2th stage, and the source is electrically coupled to the drain of the fortieth P-type thin film transistor, and a drain is electrically coupled to the scan driving signal.

Both a gate and a source of the fortieth P-type thin film transistor are electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

A gate of the fortieth P-type thin film transistor is electrically coupled to an M+2th clock signal, and a source is electrically coupled to the first node, and a drain is electrically coupled to a gate and a source of the forty-first P-type thin film transistor; both a gate and a source of the forty-first P-type thin film transistor are electrically coupled to the drain of the fortieth P-type thin film transistor, and a drain is electrically coupled to the scan driving signal.

The inverter comprises a fifty-second P-type thin film transistor, and a gate of the fifty-second P-type thin film transistor is electrically coupled to the first node, and a source is electrically coupled to a second constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to the constant negative voltage level, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node.

The inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-second P-type thin film transistor and a gate of the sixty-fourth P-type thin film transistor is electrically coupled to the first node, and a source is electrically coupled to a second constant positive voltage level, and a drain is electrically coupled to a fifth node; a sixty-first P-type thin film transistor and both a gate and a source of the sixty-first P-type thin film transistor are electrically coupled to the constant negative voltage level, and a drain is electrically coupled to a fifth node; a sixty-fourth P-type thin film transistor and a gate of the sixty-fourth P-type thin film transistor is electrically coupled to the first node, and a source is electrically coupled to the second constant positive voltage level, and a drain is electrically coupled to the fourth node; a sixty-third P-type thin film transistor and a gate of the sixty-third P-type thin film transistor is electrically coupled to the fifth node, and a source is electrically coupled to the constant negative voltage level, and a drain is electrically coupled to the fourth node.

The inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-fourth P-type thin film transistor and a gate of the sixty-fourth P-type thin film transistor is electrically coupled to the first node, and a source is electrically coupled to a second constant positive voltage level, and a drain is electrically coupled to the fourth node; a sixty-third P-type thin film transistor and a gate of the sixty-third P-type thin film transistor is electrically coupled to the third node, and a source is electrically coupled to the constant negative voltage level, and a drain is electrically coupled to the fourth node.

The present invention further provides a PMOS gate driving circuit, comprising a plurality of GOA unit circuits which are cascade connected, and the GOA unit circuit of every stage comprises a pull-up controlling module, a pull-up module, a transmission module, a first pull-down module, a bootstrap capacitor and a pull-down holding module;

N is set to be a positive integer, and in the GOA unit circuit of the Nth stage:

the pull-up controlling module is electrically coupled to a first node and the pull-down holding module; the pull-up controlling module at least comprises a P type thin film transistor, and at least receives a stage transfer signal of the GOA unit circuit of the former N−1th stage and a constant negative voltage level;

the pull-up module comprises: a twenty-second P-type thin film transistor, and a gate of the twenty-second P-type thin film transistor is electrically coupled to the first node, and a source is electrically coupled to an Mth clock signal, and a drain is electrically coupled to a scan driving signal;

the transmission module comprises: a twenty-first P-type thin film transistor, and a gate of the twenty-first P-type thin film transistor is electrically coupled to the first node, and a source is electrically coupled to the Mth clock signal, and a drain is electrically coupled to the stage transfer signal;

the first pull-down module is electrically coupled to the first node and the scan driving signal, and comprises a fortieth P-type thin film transistor and a forty-first P-type thin film transistor which are mutually cascade connected, and employed to pull up a voltage level of the first node to a voltage level of the scan driving signal in a non-functioning period;

one end of the bootstrap capacitor is electrically coupled to the first node, and the other end is electrically coupled to the scan driving signal;

the pull-down holding module comprises: an inverter comprising a plurality of P-type thin film transistor, and an input end of the inverter is electrically coupled to the first node, and an output end is electrically coupled to a second node; a thirty-second P-type thin film transistor, and a gate of the thirty-second P-type thin film transistor is electrically coupled to the second node, and a source is electrically coupled to a drain of the forty-first P-type thin film transistor, and a drain is electrically coupled to a first constant positive voltage level; a forty-second P-type thin film transistor, and a gate of the forty-second P-type thin film transistor is electrically coupled to the second node, and a drain is electrically coupled to the first node, and a source is electrically coupled to a drain of an eighty-second P-type thin film transistor; the eighty-second P-type thin film transistor, and a gate of the eighty-second P-type thin film transistor is electrically coupled to the first node, and a source is electrically coupled to the constant negative voltage level, and the drain is electrically coupled to a drain of an eighty-first P-type thin film transistor; the eighty-first P-type thin film transistor, and a gate of the eighty-first P-type thin film transistor is electrically couple to the second node, and a source is electrically couple to a second constant positive voltage level, and the drain is electrically couple to the drain of the eighty-second P-type thin film transistor;

the first constant positive voltage level is lower than the second constant positive voltage level;

wherein the pull-up controlling module comprises one P-type thin film transistor: an eleventh P-type thin film transistor, and a gate of the eleventh P-type thin film transistor receives the stage transfer signal of the GOA unit circuit of the former N−1th stage, and a source receives the constant negative voltage level, and a drain is electrically coupled to the first node;

wherein a gate of the fortieth P-type thin film transistor is electrically coupled to a stage transfer signal of the GOA unit circuit of the next second N+2th stage or a scan driving signal of the next second N+2th stage, and a source is electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

The benefits of the present invention are: the present invention provides a PMOS gate driving circuit, wherein the pull-up controlling module receives a constant negative voltage level, which can reduce the influence of PMOS element leakage to the first node; the pull-down holding module is provided with a dual inverter comprising P-type thin film transistors, and utilizes special leakage prevention design, which can reduce the leakage of the first node to prevent the influence of the electrical property of the depletion-mode P-type thin film transistors to the output of the inverter, raise the stability of the gate driving circuit, and promote the integration of the panel. The frame width of the liquid crystal display panel can be decreased in advance, particularly to be suitable for small size panel which requires higher demands to the frame width.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
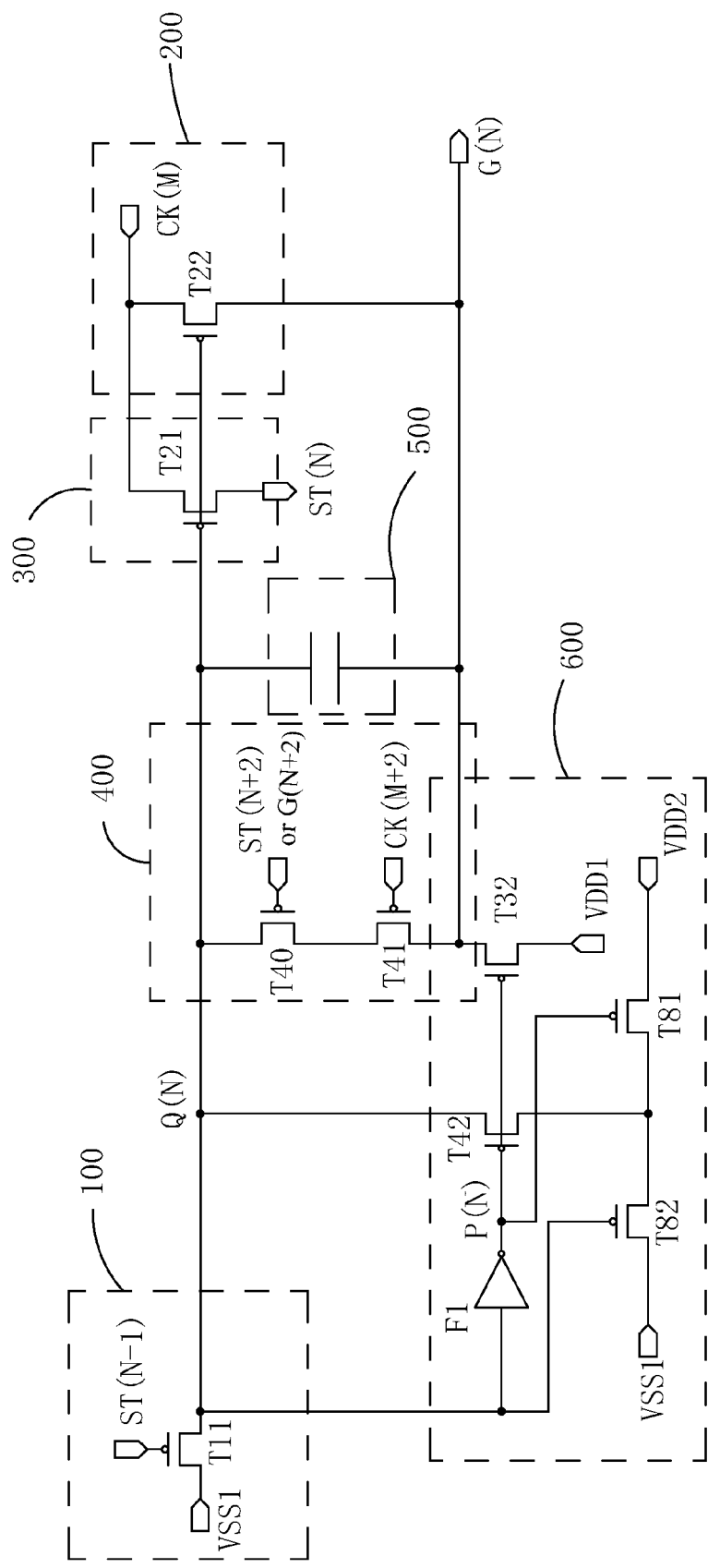
FIG. 1 is a circuit diagram of a PMOS gate driving circuit according to the first embodiment of the present invention.

The present invention provides a PMOS gate driving circuit. FIG. 1 shows a circuit diagram of the first embodiment according to the present invention. The PMOS gate driving circuit comprises a plurality of GOA unit circuits which are cascade connected, and the GOA unit circuit of every stage comprises a pull-up controlling module 100, a pull-up module 200, a transmission module 300, a first pull-down module 400, a bootstrap capacitor 500 and a pull-down holding module 600.

N is set to be a positive integer, and in the GOA unit circuit of the Nth stage:

the pull-up controlling module 100 comprises one P-type thin film transistor: an eleventh P-type thin film transistor T11, and a gate of the eleventh P-type thin film transistor T11 receives the stage transfer signal ST(N−1) of the GOA unit circuit of the former N−1th stage, and a source receives the constant negative voltage level VSS1, and a drain is electrically coupled to the first node Q(N).

The pull-up module 200 comprises: a twenty-second P-type thin film transistor T22, and a gate of the twenty-second P-type thin film transistor T22 is electrically coupled to the first node Q(N), and a source is electrically coupled to an Mth clock signal CK(M), and a drain is electrically coupled to a scan driving signal G(N).

The transmission module 300 comprises: a twenty-first P-type thin film transistor T21, and a gate of the twenty-first P-type thin film transistor T21 is electrically coupled to the first node Q(N), and a source is electrically coupled to the Mth clock signal CK(M), and a drain is electrically coupled to the stage transfer signal ST(N).

The first pull-down module 400 comprises a fortieth P-type thin film transistor T40 and a forty-first P-type thin film transistor T41 which are mutually cascade connected; a gate of the fortieth P-type thin film transistor T40 is electrically coupled to a stage transfer signal ST(N+2) of the GOA unit circuit of the next second N+2th stage or a scan driving signal G(N+2) of the next second N+2th stage, and a source is electrically coupled to the first node Q(N), and a drain is electrically coupled to a source of the forty-first P-type thin film transistor T41; a gate of the forty-first P-type thin film transistor T41 is electrically coupled to an M+2th clock signal CK(M+2), and the source is electrically coupled to the drain of the fortieth P-type thin film transistor T40, and a drain is electrically coupled to the scan driving signal G(N).

One end of the bootstrap capacitor 500 is electrically coupled to the first node Q(N), and the other end is electrically coupled to the scan driving signal G(N).

The pull-down holding module 600 comprises: an inverter F1 comprising a plurality of P-type thin film transistor, and an input end of the inverter F1 is electrically coupled to the first node Q(N), and an output end is electrically coupled to a second node P(N); a thirty-second P-type thin film transistor T32, and a gate of the thirty-second P-type thin film transistor T32 is electrically coupled to the second node P(N), and a source is electrically coupled to a drain of the forty-first P-type thin film transistor T41, and a drain is electrically coupled to a first constant positive voltage level VDD1; a forty-second P-type thin film transistor T42, and a gate of the forty-second P-type thin film transistor T42 is electrically coupled to the second node P(N), and a drain is electrically coupled to the first node Q(N), and a source is electrically coupled to a drain of an eighty-second P-type thin film transistor T82; the eighty-second P-type thin film transistor T82, and a gate of the eighty-second P-type thin film transistor T82 is electrically coupled to the first node Q(N), and a source is electrically coupled to the constant negative voltage level VSS1, and the drain is electrically coupled to a drain of an eighty-first P-type thin film transistor T81; the eighty-first P-type thin film transistor T81, and a gate of the eighty-first P-type thin film transistor T81 is electrically couple to the second node P(N), and a source is electrically couple to a second constant positive voltage level VDD2, and the drain is electrically couple to the drain of the eighty-second P-type thin film transistor T82.

Figure 2:
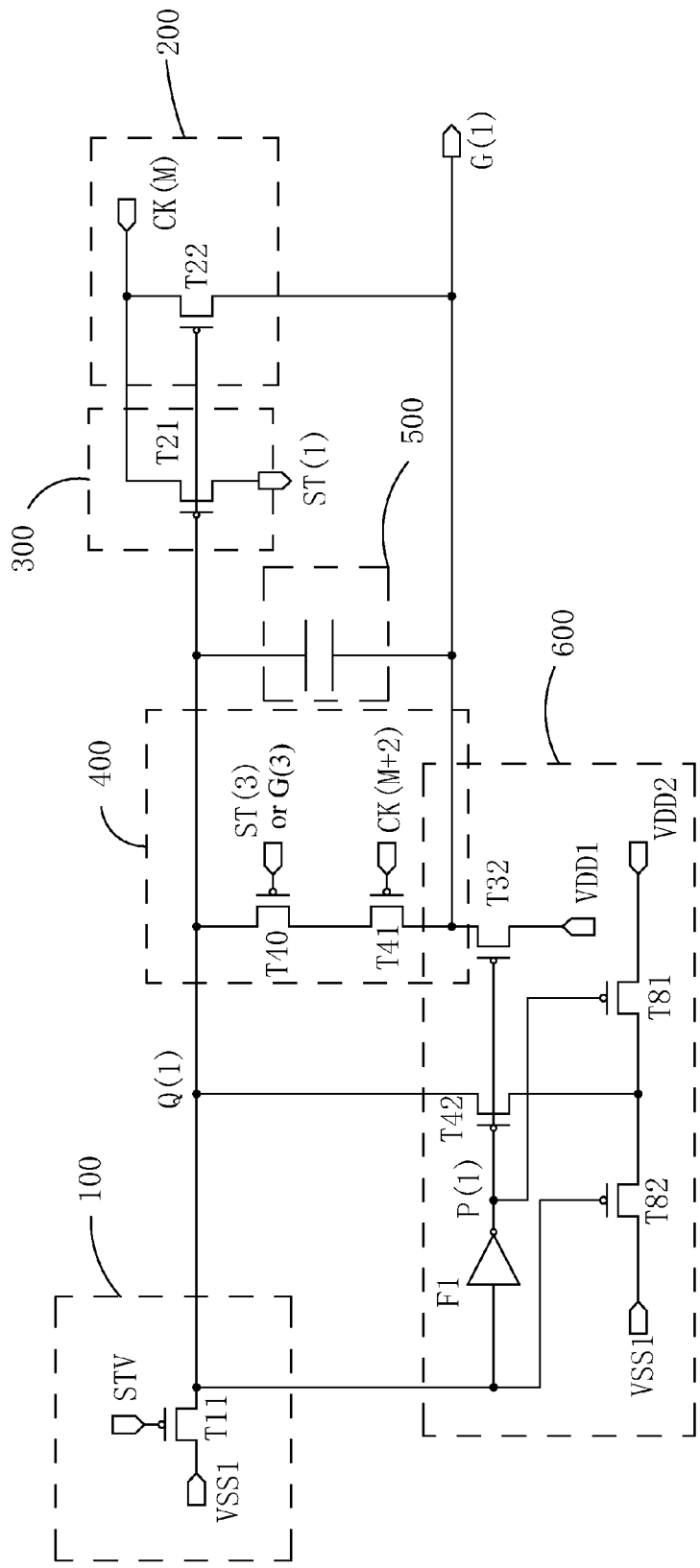
FIG. 2 is a circuit diagram of a GOA unit circuit of the first stage of the first embodiment according to the PMOS gate driving circuit of the present invention.
Figure 3:
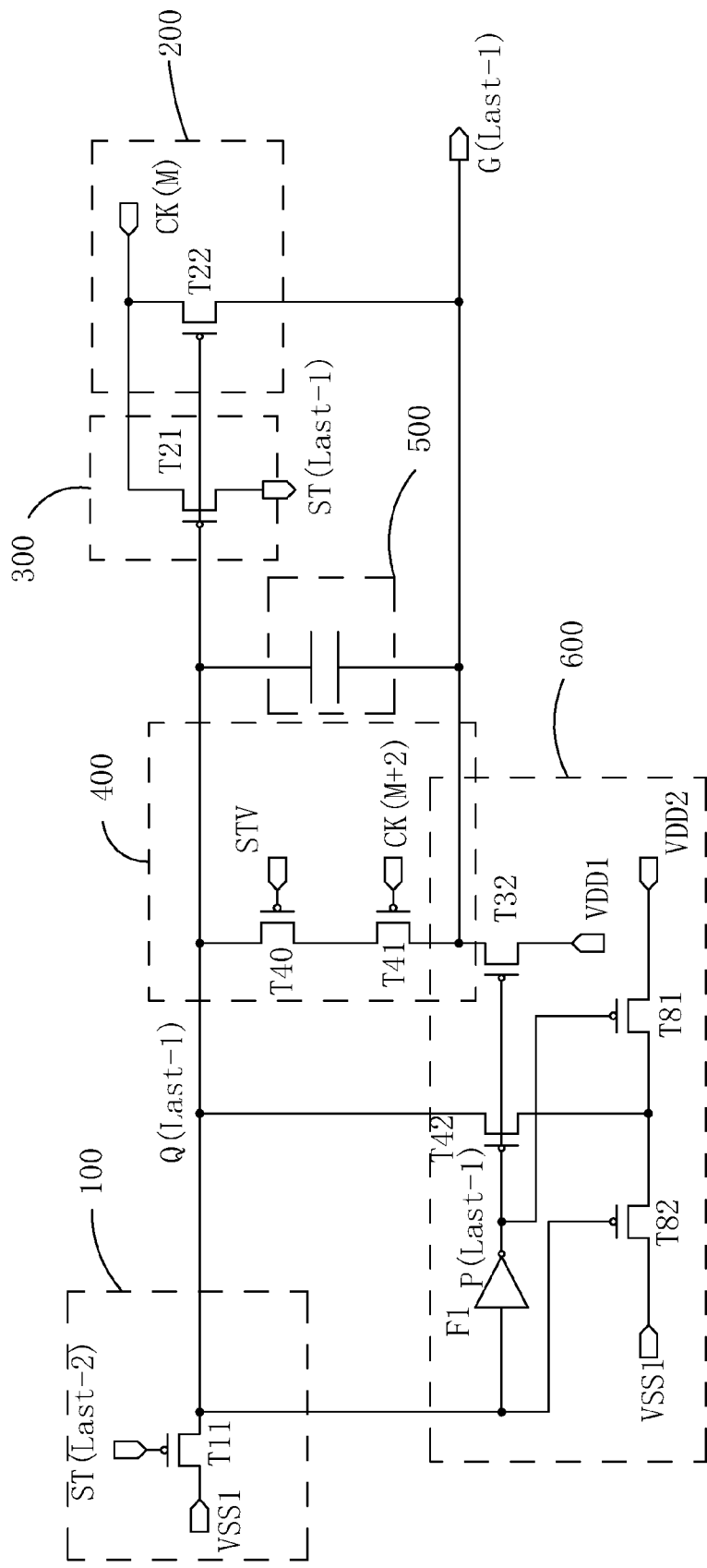
FIG. 3 is a circuit diagram of a GOA unit circuit of the next stage to the last stage of the first embodiment according to the PMOS gate driving circuit of the present invention.
Figure 4:
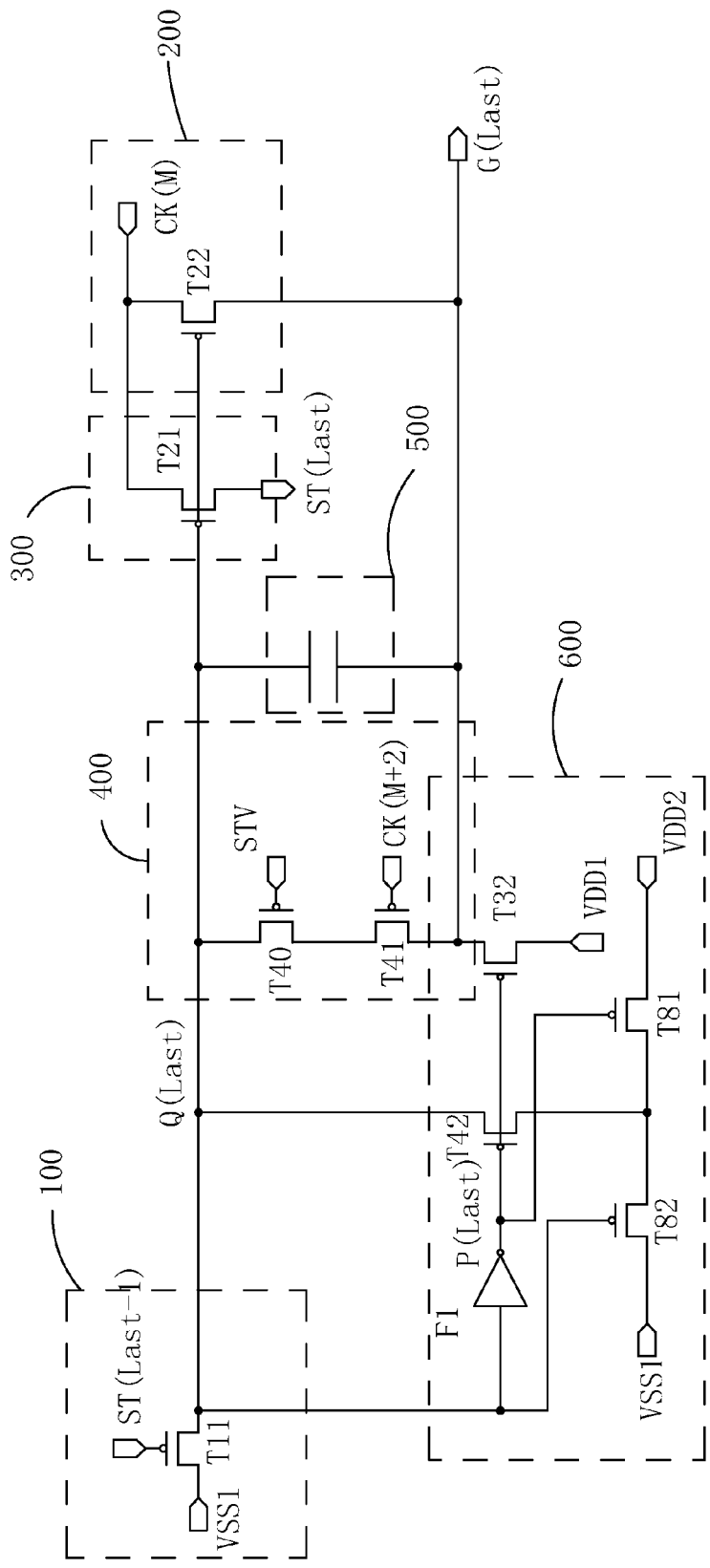
FIG. 4 is a circuit diagram of a GOA unit circuit of the last stage of the first embodiment according to the PMOS gate driving circuit of the present invention.

Significantly, please refer to FIG. 2, FIG. 3 and FIG. 4. As shown in FIG. 2, in the relationship of the first stage of the first embodiment according to the PMOS gate driving circuit of the present invention, the gate of the eleventh P-type thin film transistor T11 is electrically coupled to a start signal STV; as shown in FIG. 3, FIG. 4, in the relationships of the next stage to the last stage and the last stage of the first embodiment according to the PMOS gate driving circuit of the present invention, the gate of the fortieth P-type thin film transistor T40 is electrically coupled to a start signal STV.

Figure 5:
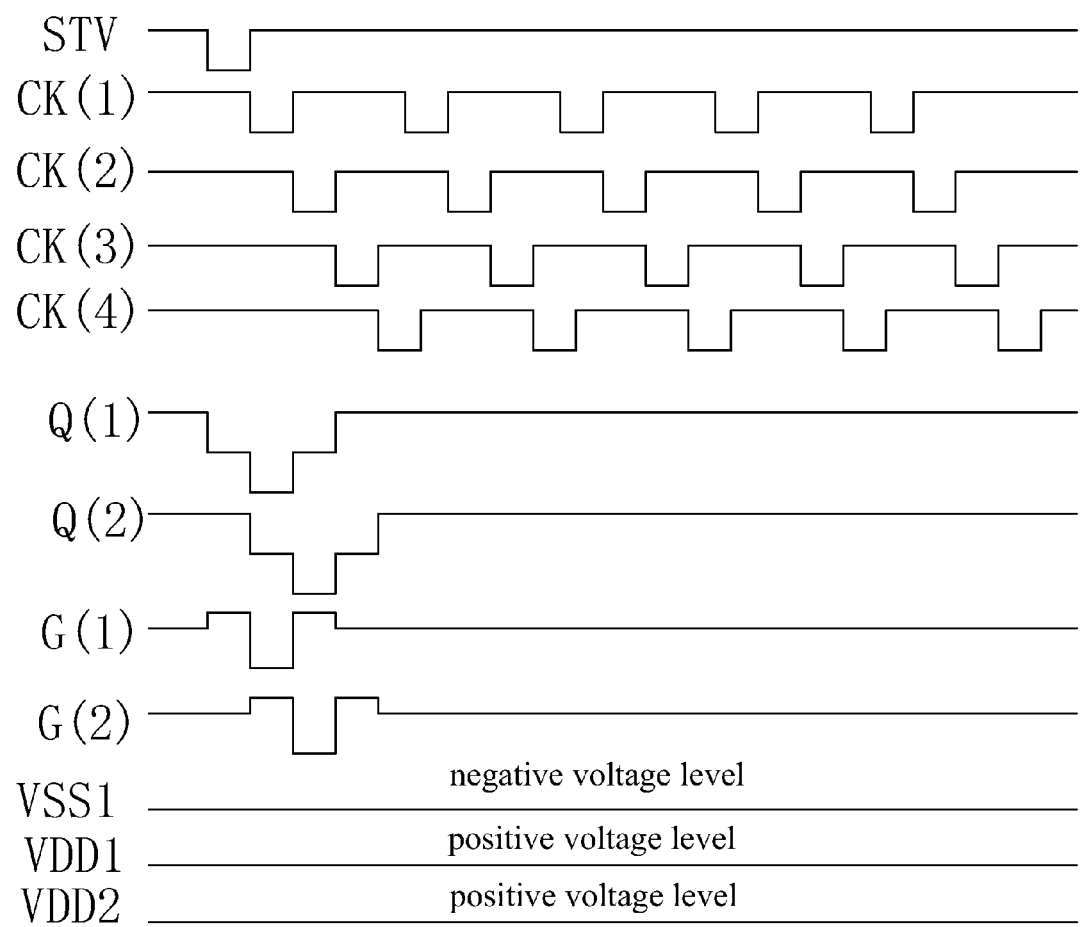
FIG. 5 is a sequence diagram of the PMOS gate driving circuit according to the present invention.

FIG. 5 is a sequence diagram of the PMOS gate driving circuit according to the present invention. STV represents a start signal of the circuit; CK(1), CK(2), CK(3) and CK(4) are four set clock signals included in the clock signal CK(M), of which all are high frequency clock signals, and as the clock signal CK(M) is the third clock signal CK(3), the M+2th clock signal CK(M+2) is the first clock signal CK(1), and as the clock signal CK(M) is the fourth clock signal CK(4), the M+2th clock signal CK(M+2) is the second clock signal CK(2); Q(1), Q(2) respectively are waveforms of the first nodes Q(N) in the GOA unit circuits of first stage, the second stage; G(1), G(2) respectively are waveforms of the scan driving signals G(N) outputted by the GOA unit circuits of first stage, the second stage; VSS1 is the constant negative voltage level; VDD1, VDD respectively are the first, the second constant positive voltage levels, and the first constant positive voltage level VDD1 is lower than the second constant positive voltage level VDD2.

Specifically, with conjunction of FIG. 1, FIG. 5, the working procedures of the first embodiment of the PMOS gate driving circuit are:

As the stage transfer signal ST(N−1) of the GOA unit circuit of the former N−1th stage is low voltage level, the eleventh P-type thin film transistor T11 is activated, and the constant negative voltage level VSS1 enters the circuit to charge the bootstrap capacitor 500 to make the first node Q(N) obtain a negative voltage level, and then, along with that the stage transfer signal ST(N−1) of the GOA unit circuit of the former N−1th stage becomes high voltage level, the first node Q(N) keeps to be the negative voltage level with the bootstrap capacitor 500, and meanwhile, the twenty-first P-type thin film transistor T21 and the twenty-second P-type thin film transistor T22 are controlled by the first node Q(N) to be activated.

Then, the Mth clock signal CK(M) is low voltage level, and the charge to the bootstrap capacitor 500 remains through the twenty-second P-type thin film transistor T22 to make the first node Q(N) reach a lower voltage level, and in the mean time, the drain of the twenty-second P-type thin film transistor T22 outputs the scan driving signal G(N), and the drain of the twenty-first P-type thin film transistor T21 outputs the stage transfer signal ST(N), and both the scan driving signal G(N) and the stage transfer signal ST(N) are low voltage levels. For the PMOS gate driving circuit, the time slot as the scan driving signal G(N) is low voltage level is generally named as the functioning period. In the functioning period, the first node Q(N) is low voltage level, and the second node P(N) is high voltage level after the inverter F1 inverts. In the pull-down holding module 600, the eighty-second P-type thin film transistor T82 is activated, and all the eighty-first P-type thin film transistor T81, the forty-second P-type thin film transistor T42 and the thirty-second P-type thin film transistor T32 are deactivated, and a source voltage level of the forty-second P-type thin film transistor T42 is pulled down to the constant negative voltage level VSS1 to reduce the leakage of the first node Q(N) via the forty-second P-type thin film transistor T42. Besides, the leakage of the first node Q(N) also can be reduced by performing the signal transfer of the eleventh P-type thin film transistor T11 with utilizing the constant negative voltage level VSS1.

Then, the Mth clock signal CK(M) becomes high voltage level. Correspondingly, both the scan driving signal G(N) outputted by the drain of the twenty-second P-type thin film transistor T22 and the stage transfer signal ST(N) outputted by the drain of the twenty-first P-type thin film transistor T21 also become high voltage levels, and the circuit enters the non-functioning period. When the M+2th clock signal CK(M+2), the stage transfer signal ST(N+2) of the GOA unit circuit of the next second N+2th stage and the scan driving signal G(N+2) of the next second N+2th stage become low voltage levels, both the fortieth P-type thin film transistor T40 and the forty-first P-type thin film transistor T41 are activated. The voltage level of the first node Q(N) is pulled up to high voltage level of the scan driving signal G(N), and the twenty-first P-type thin film transistor T21 and both the twenty-second P-type thin film transistor T22 are deactivated; in the non-functioning period, because the voltage level of the first node Q(N) is high voltage level, the second node P(N) is low voltage level after the inverter F1 inverts. In the pull-down holding module 600, the eighty-second P-type thin film transistor T82 is deactivated, and all the eighty-first P-type thin film transistor T81, the forty-second P-type thin film transistor T42 and the thirty-second P-type thin film transistor T32 are activated. The voltage level of the first node Q(N) is raised and kept at the second constant positive voltage level VDD2 by the forty-second P-type thin film transistor T42 and the eighty-first P-type thin film transistor T81.

Figure 13:
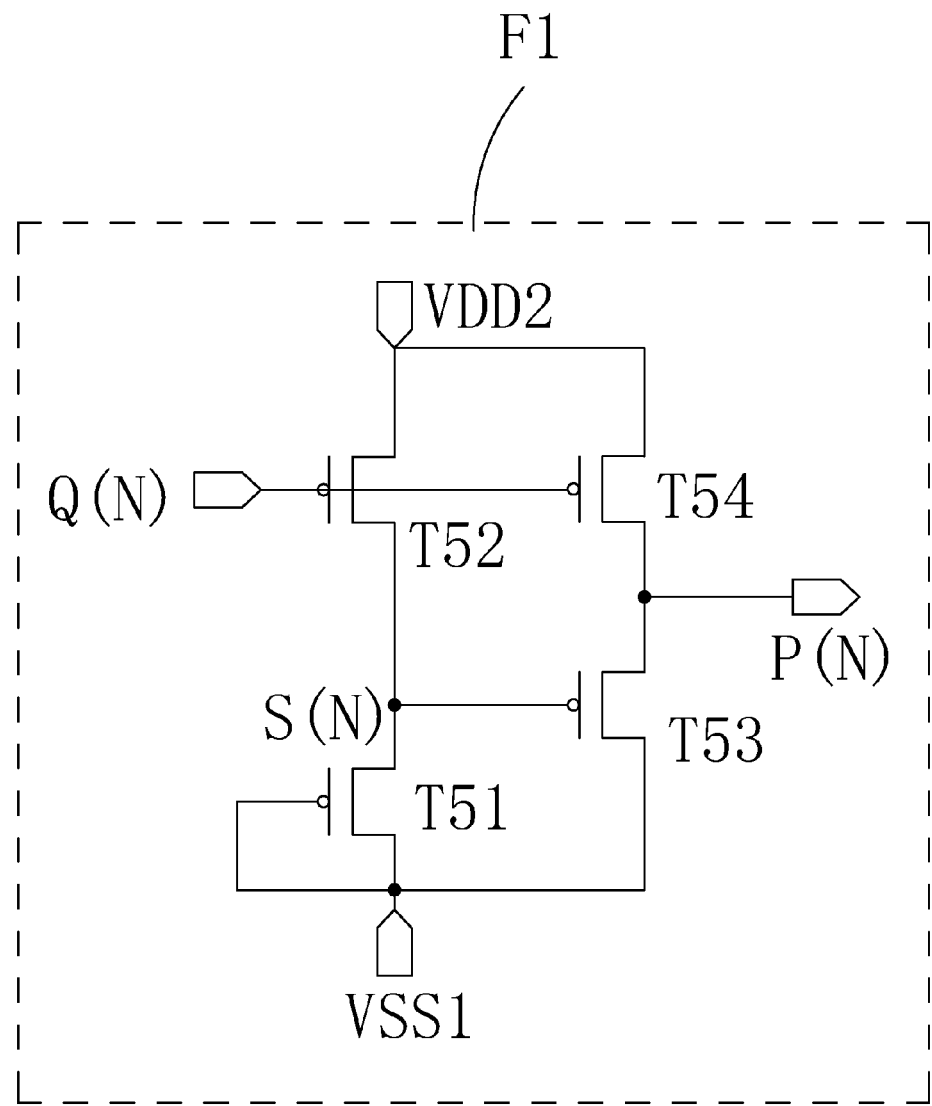
FIG. 13 is a first circuit structural diagram of an inverter in the PMOS gate driving circuit according to present invention.
Figure 14:
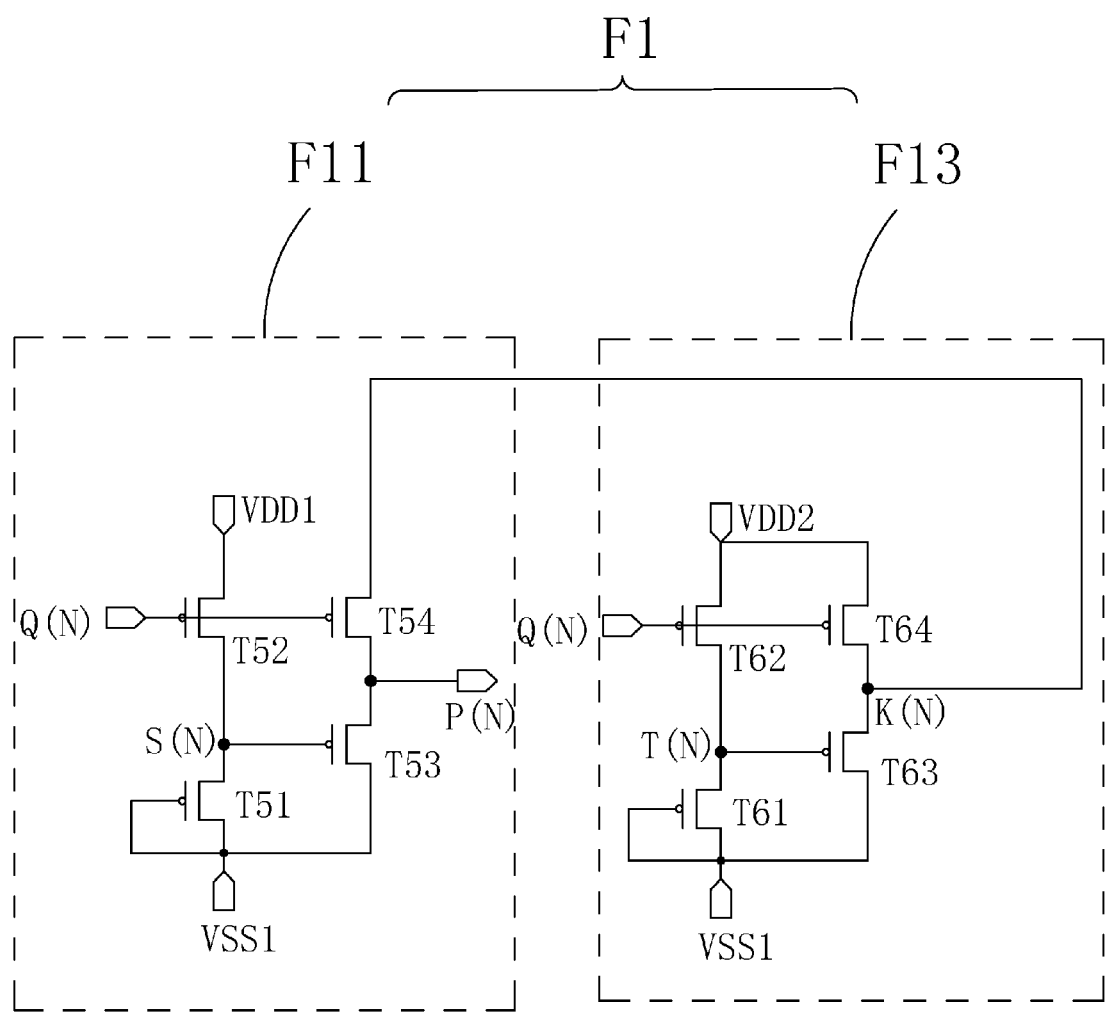
FIG. 14 is a second circuit structural diagram of an inverter in the PMOS gate driving circuit according to the present invention.
Figure 15:
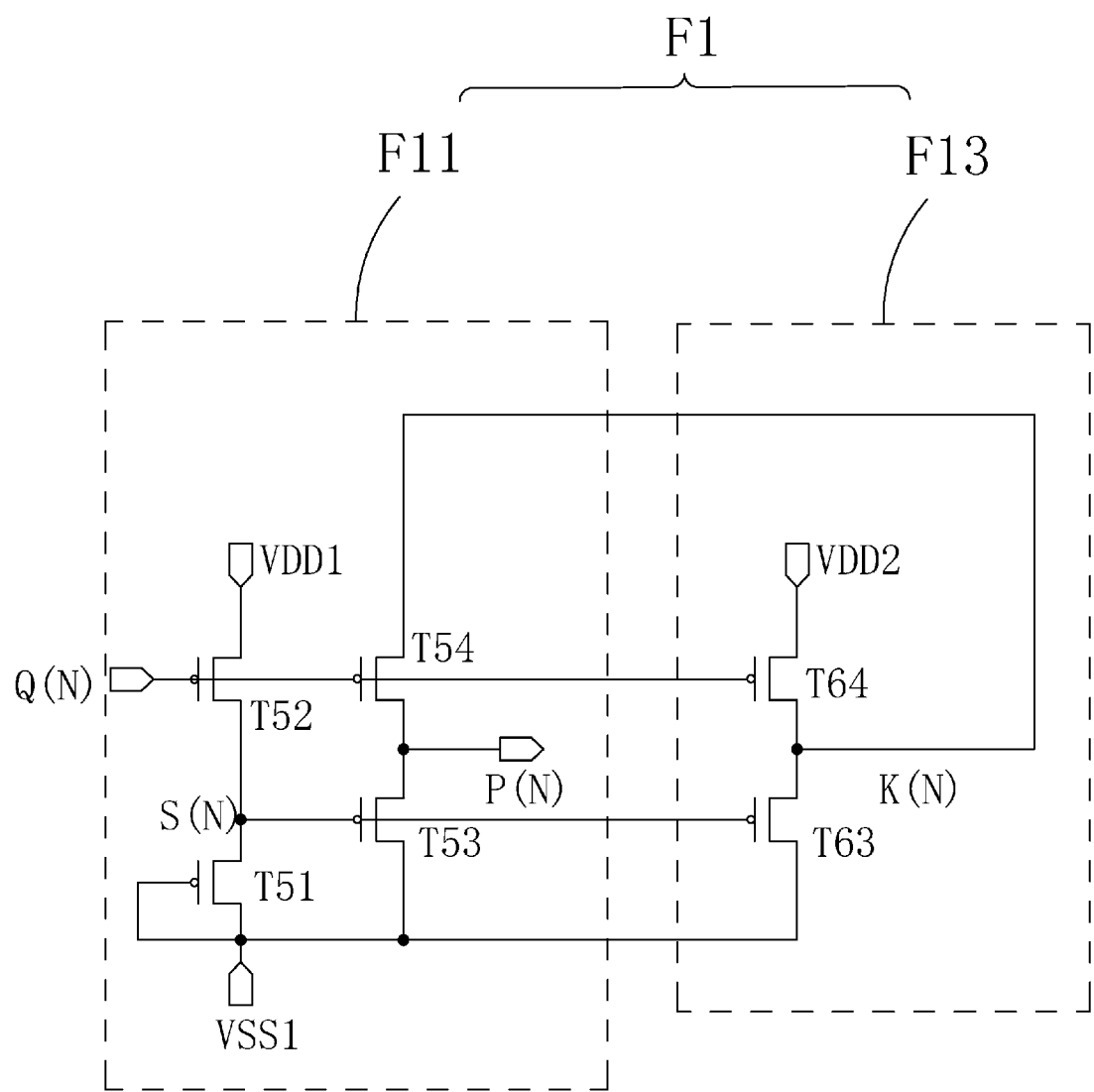
FIG. 15 is a third circuit structural diagram of an inverter in the PMOS gate driving circuit according to the present invention.

Furthermore, the inverter F1 comprises three kinds of structures as respectively shown in FIG. 13, FIG. 14, FIG. 15.

The structure of the first type inverter F1 is shown in FIG. 13, and comprises a fifty-second P-type thin film transistor T52, and a gate of the fifty-second P-type thin film transistor T52 is electrically coupled to the first node Q(N), and a source is electrically coupled to a second constant positive voltage level VDD2, and a drain is electrically coupled to a third node S(N); a fifty-first P-type thin film transistor T51, and both a gate and a source of the fifty-first P-type thin film transistor T51 are electrically coupled to a constant negative voltage level VSS1, and a drain is electrically coupled to the third node S(N); a fifty-fourth P-type thin film transistor T54, and a gate of the fifty-fourth P-type thin film transistor T54 is electrically coupled to the first node Q(N), and a source is electrically coupled to the second constant positive voltage level VDD2, and a drain is electrically coupled to the second node P(N); a fifty-third P-type thin film transistor T53, and a gate of the fifty-third P-type thin film transistor T53 is electrically coupled to the third node S(N), and a source is electrically coupled to the constant negative voltage level VSS1, and a drain is electrically coupled to the second node P(N).

When the first node Q(N) is low voltage level in the functioning period, both the fifty-second P-type thin film transistor T52 and the fifty-fourth P-type thin film transistor T54 are activated, and the fifty-first P-type thin film transistor T51 and the fifty-third P-type thin film transistor T53 are deactivated, and the voltage level of the second node P(N) is the second constant positive voltage level VDD2; when the first node Q(N) is high voltage level in the non-functioning period, both the fifty-second P-type thin film transistor T52 and the fifty-fourth P-type thin film transistor T54 are deactivated, and the fifty-first P-type thin film transistor T51 and the fifty-third P-type thin film transistor T53 are activated, and the voltage level of the second node P(N) is the constant negative voltage level VSS1.

The structure of the second type inverter F1 is shown in FIG. 14. The inverter F1 is a dual inverter, comprising a main inverter 11 and an auxiliary inverter 13.

The main inverter F11 comprises a fifty-second P-type thin film transistor T52, and a gate of the fifty-second P-type thin film transistor T52 is electrically coupled to the first node Q(N), and a source is electrically coupled to a first constant positive voltage level VDD1, and a drain is electrically coupled to a third node S(N); a fifty-first P-type thin film transistor T51, and both a gate and a source of the fifty-first P-type thin film transistor T51 are electrically coupled to a constant negative voltage level VSS1, and a drain is electrically coupled to the third node S(N); a fifty-fourth P-type thin film transistor T54, and a gate of the fifty-fourth P-type thin film transistor T54 is electrically coupled to the first node Q(N), and a source is electrically coupled to a fourth node K(N), and a drain is electrically coupled to the second node P(N); a fifty-third P-type thin film transistor T53, and a gate of the fifty-third P-type thin film transistor T53 is electrically coupled to the third node S(N), and a source is electrically coupled to the constant negative voltage level VSS1, and a drain is electrically coupled to the second node P(N); the auxiliary inverter F13 comprises a sixty-second P-type thin film transistor T62 and a gate of the sixty-second P-type thin film transistor T62 is electrically coupled to the first node Q(N), and a source is electrically coupled to a second constant positive voltage level VDD2, and a drain is electrically coupled to a fifth node T(N); a sixty-first P-type thin film transistor T61 and both a gate and a source of the sixty-first P-type thin film transistor T61 are electrically coupled to the constant negative voltage level VSS1, and a drain is electrically coupled to a fifth node T(N); a sixty-fourth P-type thin film transistor T64 and a gate of the sixty-fourth P-type thin film transistor T64 is electrically coupled to the first node Q(N), and a source is electrically coupled to the second constant positive voltage level VDD2, and a drain is electrically coupled to the fourth node K(N); a sixty-third P-type thin film transistor T63 and a gate of the sixty-third P-type thin film transistor T63 is electrically coupled to the fifth node T(N), and a source is electrically coupled to the constant negative voltage level VSS1, and a drain is electrically coupled to the fourth node K(N).

When the first node Q(N) is low voltage level in the functioning period, both the fifty-second P-type thin film transistor T52 and the fifty-fourth P-type thin film transistor T54 in the main inverter F11 are activated, and the fifty-first P-type thin film transistor T51 and the fifty-third P-type thin film transistor T53 are deactivated, and both the sixty-second P-type thin film transistor T62 and the sixty-fourth P-type thin film transistor T64 in the auxiliary inverter F13 are activated, and the voltage level of the second node P(N) is raised to the second constant positive voltage level VDD2, which higher than the first constant positive voltage level VDD1; when the first node Q(N) is high voltage level in the non-functioning period, both the fifty-second P-type thin film transistor T52 and the fifty-fourth P-type thin film transistor T54 in the main inverter F11 are deactivated, and both the fifty-first P-type thin film transistor T51 and the fifty-third P-type thin film transistor T53 are activated, and the voltage level of the second node P(N) is the constant negative voltage level VSS1.

The structure of the third type inverter F1 is shown in FIG. 15. The inverter F1 is a dual inverter, comprising a main inverter 11 and an auxiliary inverter 13.

The main inverter F11 comprises a fifty-second P-type thin film transistor T52, and a gate of the fifty-second P-type thin film transistor T52 is electrically coupled to the first node Q(N), and a source is electrically coupled to a first constant positive voltage level VDD1, and a drain is electrically coupled to a third node S(N); a fifty-first P-type thin film transistor T51, and both a gate and a source of the fifty-first P-type thin film transistor T51 are electrically coupled to a constant negative voltage level VSS1, and a drain is electrically coupled to the third node S(N); a fifty-fourth P-type thin film transistor T54, and a gate of the fifty-fourth P-type thin film transistor T54 is electrically coupled to the first node Q(N), and a source is electrically coupled to a fourth node K(N), and a drain is electrically coupled to the second node P(N); a fifty-third P-type thin film transistor T53, and a gate of the fifty-third P-type thin film transistor T53 is electrically coupled to the third node S(N), and a source is electrically coupled to the constant negative voltage level VSS1, and a drain is electrically coupled to the second node P(N); the auxiliary inverter F13 comprises a sixty-fourth P-type thin film transistor T64 and a gate of the sixty-fourth P-type thin film transistor T64 is electrically coupled to the first node Q(N), and a source is electrically coupled to the second constant positive voltage level VDD2, and a drain is electrically coupled to the fourth node K(N); a sixty-third P-type thin film transistor T63 and a gate of the sixty-third P-type thin film transistor T63 is electrically coupled to the third node S(N), and a source is electrically coupled to the constant negative voltage level VSS1, and a drain is electrically coupled to the fourth node K(N). The structure of the third inverter F1 diminishes two P-type thin film transistors and simplifies the circuit while achieving the dual inverter result.

When the first node Q(N) is low voltage level in the functioning period, both the fifty-second P-type thin film transistor T52 and the fifty-fourth P-type thin film transistor T54 in the main inverter F11 are activated, and the fifty-first P-type thin film transistor T51 and the fifty-third P-type thin film transistor T53 are deactivated, and the sixty-fourth P-type thin film transistor T64 in the auxiliary inverter F13 is activated, and the sixty-third P-type thin film transistor T63 is deactivated, and the voltage level of the second node P(N) is raised to the second constant positive voltage level VDD2, which higher than the first constant positive voltage level VDD1; when the first node Q(N) is high voltage level in the non-functioning period, both the fifty-second P-type thin film transistor T52 and the fifty-fourth P-type thin film transistor T54 in the main inverter F11 are deactivated, and both the fifty-first P-type thin film transistor T51 and the fifty-third P-type thin film transistor T53 are activated, and the voltage level of the second node P(N) is the constant negative voltage level VSS1.

In the dual inverter shown in the aforesaid FIG. 14, FIG. 15, the auxiliary inverter F13 can provide a higher voltage level to the main inverter F11 in the functioning period to ensure reducing the leakage of the first node Q(N) to prevent the influence of the electrical property of the depletion-mode P-type thin film transistors to the output of the inverter.

Figure 6:
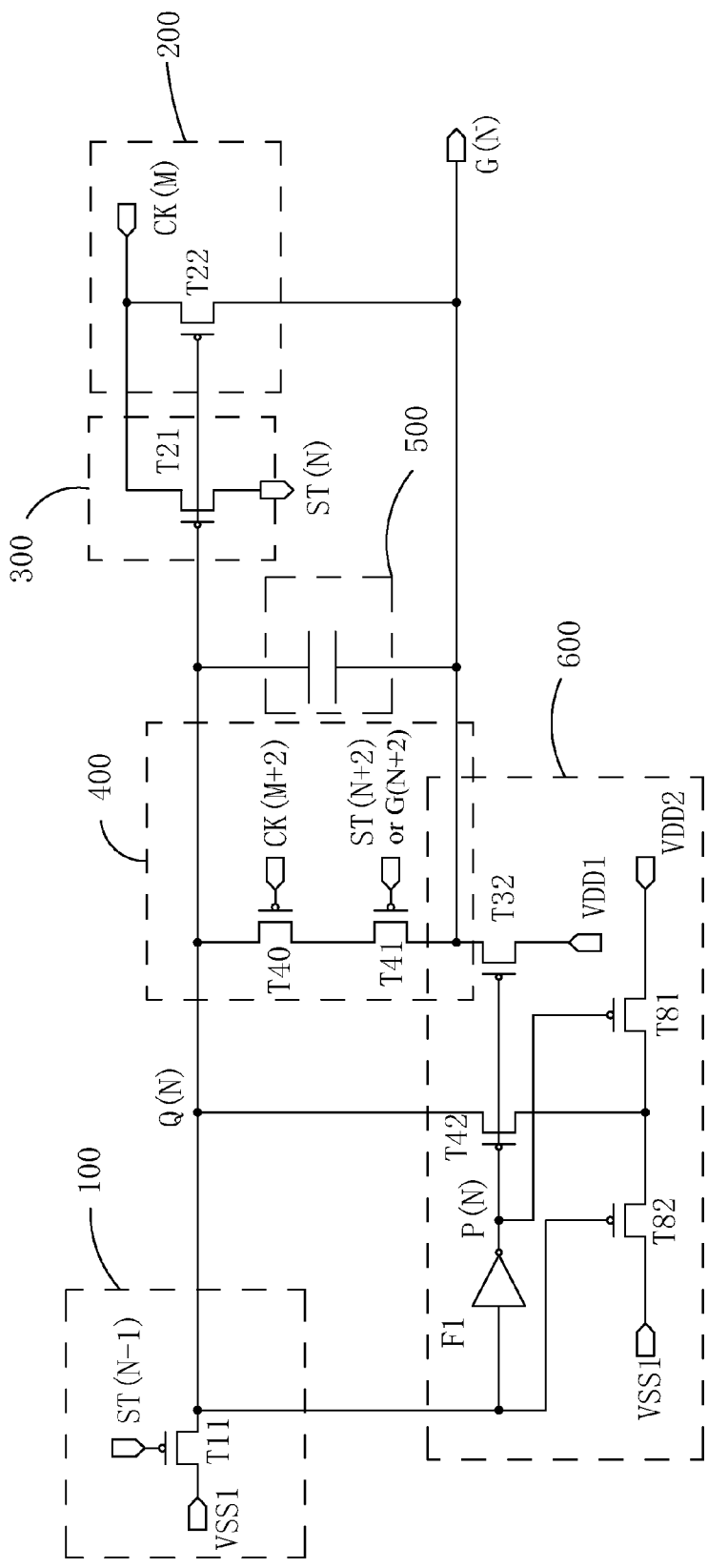
FIG. 6 is a circuit diagram of a PMOS gate driving circuit according to the second embodiment of the present invention.

Please refer to FIG. 6, which is a circuit diagram of a PMOS gate driving circuit according to the second embodiment of the present invention. The difference between the second embodiment and the first embodiment merely is that the received signals of the fortieth P-type thin film transistor T40 and the forty-first P-type thin film transistor T41 of the first pull-down module 400 are mutually switched. Namely, the gate of the fortieth P-type thin film transistor T40 is electrically coupled to the M+2th clock signal CK(M+2), and the gate of the forty-first P-type thin film transistor T41 is electrically coupled to the stage transfer signal ST(N+2) of the GOA unit circuit of the next second N+2th stage or the scan driving signal G(N+2) of the next second N+2th stage. Correspondingly, in the relationship of the first stage of the second embodiment according to the PMOS gate driving circuit of the present invention, the gate of the eleventh P-type thin film transistor T11 is electrically coupled to a start signal STV, and in the relationships of the next stage to the last stage and the last stage, the gate of the forty-first P-type thin film transistor T41 is electrically coupled to a start signal STV. The others of the circuit structure and the working procedures are the same as those described in the first embodiment. The repeated explanation is omitted here.

Figure 7:
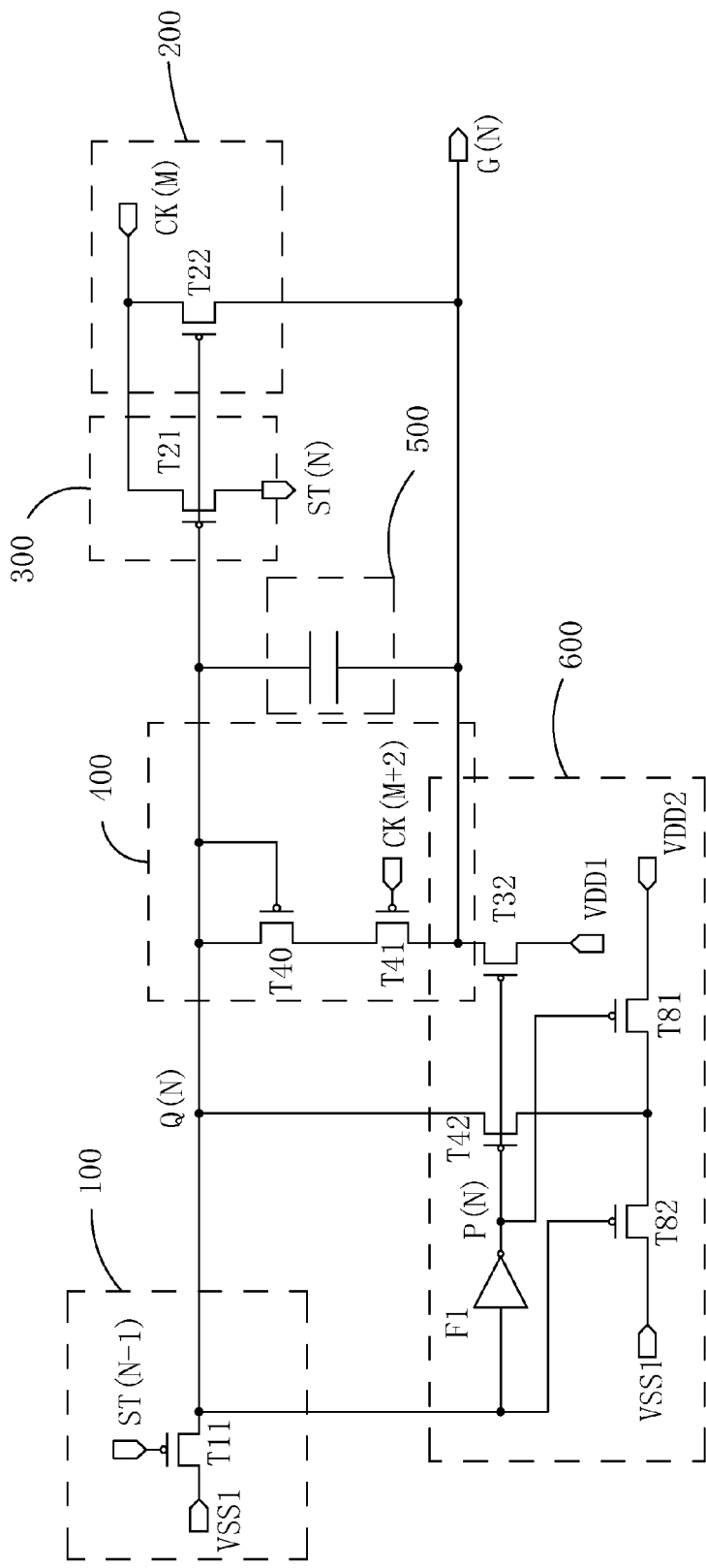
FIG. 7 is a circuit diagram of a PMOS gate driving circuit according to the third embodiment of the present invention.

Please refer to FIG. 7, which is a circuit diagram of a PMOS gate driving circuit according to the third embodiment of the present invention. The difference between the third embodiment and the first embodiment merely is that the fortieth P-type thin film transistor T40 of the first pull-down module 400 utilizes a diode-connection to reduce the leakage, i.e. both the gate and the source of the fortieth P-type thin film transistor T40 are electrically coupled to the first node Q(N), and the drain is electrically coupled to the source of the forty-first P-type thin film transistor T41; the gate of the forty-first P-type thin film transistor T41 is electrically coupled to the M+2th clock signal CK(M+2), and the source is electrically coupled to the drain of the fortieth P-type thin film transistor T40, and a drain is electrically coupled to the scan driving signal G(N). Correspondingly, in the relationship of the first stage of the third embodiment according to the PMOS gate driving circuit of the present invention, the gate of the eleventh P-type thin film transistor T11 is electrically coupled to a start signal STV. The others of the circuit structure and the working procedures are the same as those described in the first embodiment. The repeated explanation is omitted here.

Figure 8:
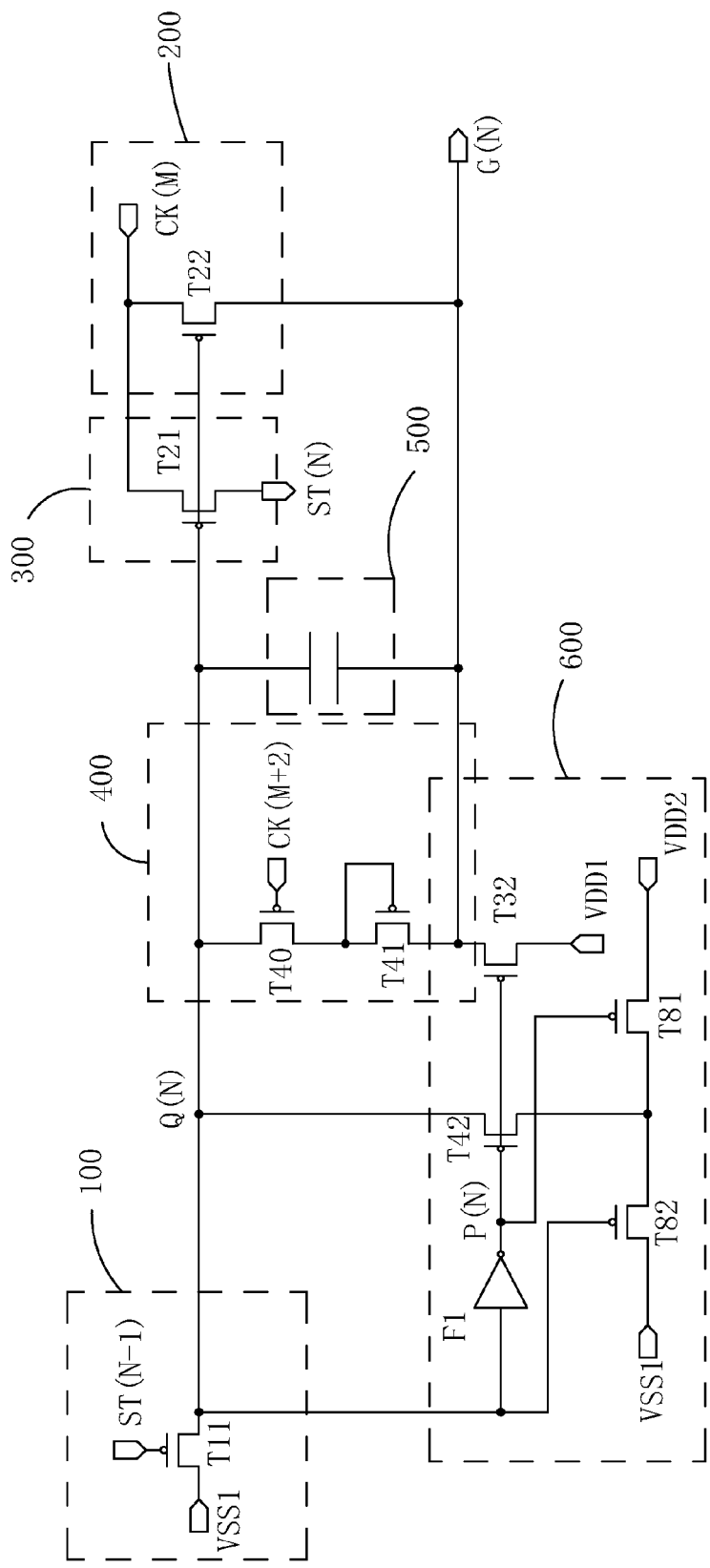
FIG. 8 is a circuit diagram of a PMOS gate driving circuit according to the fourth embodiment of the present invention.

Please refer to FIG. 8, which is a circuit diagram of a PMOS gate driving circuit according to the fourth embodiment of the present invention. The difference between the fourth embodiment and the first embodiment merely is that the forty-first P-type thin film transistor T41 of the first pull-down module 400 utilizes a diode-connection to reduce the leakage, i.e. both the gate and the source of the forty-first P-type thin film transistor T41 are electrically coupled to the drain of the fortieth P-type thin film transistor T40, and the drain is electrically coupled to the source of the scan driving signal G(N); the gate of the fortieth P-type thin film transistor T40 is electrically coupled to the M+2th clock signal CK(M+2), and the source is electrically coupled to the first node Q(N), and the drain is electrically coupled to the gate and the source of the forty-first P-type thin film transistor T41; correspondingly, in the relationship of the first stage of the fourth embodiment according to the PMOS gate driving circuit of the present invention, the gate of the eleventh P-type thin film transistor T11 is electrically coupled to a start signal STV. The others of the circuit structure and the working procedures are the same as those described in the first embodiment. The repeated explanation is omitted here.

Figure 9:
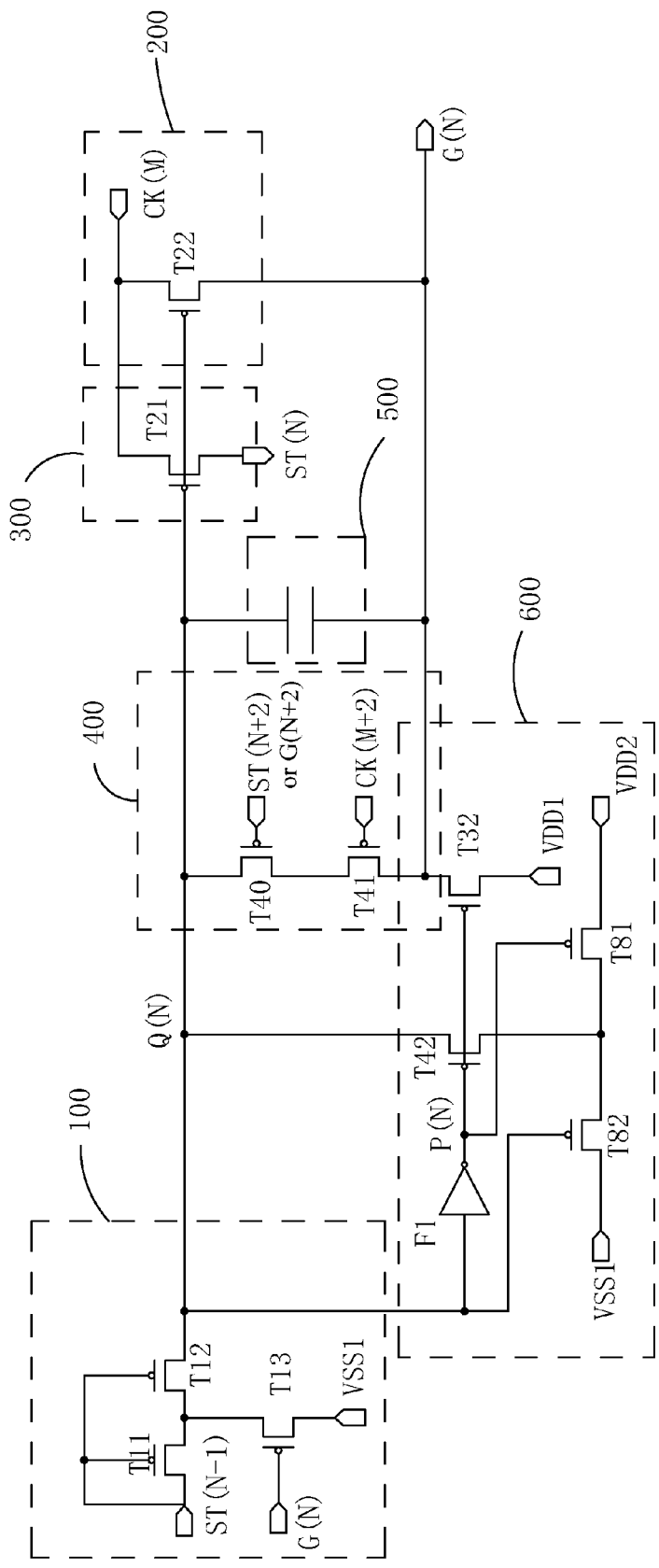
FIG. 9 is a circuit diagram of a PMOS gate driving circuit according to the fifth embodiment of the present invention.

Please refer to FIG. 9, which is a circuit diagram of a PMOS gate driving circuit according to the fifth embodiment of the present invention. The difference between the fifth embodiment and the first embodiment merely is that the pull-up controlling module 100 comprises three P-type thin film transistors: an eleventh P-type thin film transistor T11, a twelfth P-type thin film transistor T12 and a thirteenth P-type thin film transistor T13; both a gate and a source of the eleventh P-type thin film transistor T11 receive the stage transfer signal ST(N−1) of the GOA unit circuit of the former N−1th stage, and a drain is electrically coupled to a source of the twelfth P-type thin film transistor T12 and a drain of the thirteenth P-type thin film transistor T13; a gate of the twelfth P-type thin film transistor T12 receives the stage transfer signal ST(N−1) of the GOA unit circuit of the former N−1th stage, and the source is electrically coupled to the drain of the eleventh P-type thin film transistor T11, and a drain is electrically coupled to the first node Q(N); a gate of the thirteenth P-type thin film transistor T13 receives the scan driving signal G(N), and a source receives the constant negative voltage level VSS1, and the drain is electrically coupled to the drain of the eleventh P-type thin film transistor T11. Correspondingly, in the relationship of the first stage of the fifth embodiment according to the PMOS gate driving circuit of the present invention, the gate and the source of the eleventh P-type thin film transistor T11 and the gate of the twelfth P-type thin film transistor T12 are electrically coupled to a start signal STV; in the relationships of the next stage to the last stage and the last stage, the gate of the fortieth P-type thin film transistor T40 is electrically coupled to a start signal STV. The others of the circuit structure are the same as those described in the first embodiment. The repeated explanation is omitted here.

Slight differences between the working procedures of the fifth embodiment and the working procedures of the first embodiment exist. As the stage transfer signal ST(N−1) of the GOA unit circuit of the former N−1th stage is low voltage level and the scan driving signal G(N) is high voltage level, the eleventh P-type thin film transistor T11 and the twelfth P-type thin film transistor T12 are activated, and the thirteenth P-type thin film transistor T13 is deactivated, and the stage transfer signal ST(N−1) of the GOA unit circuit of the former N−1th stage enters the circuit; as the stage transfer signal ST(N−1) of the GOA unit circuit of the former N−1th stage becomes high voltage level and the scan driving signal G(N) is low voltage level, the eleventh P-type thin film transistor T11 and the twelfth P-type thin film transistor T12 are deactivated, and the thirteenth P-type thin film transistor T13 is activated, and the constant negative voltage level VSS1 enters the drain of the eleventh P-type thin film transistor T11 and the source of the twelfth P-type thin film transistor T12 to make the deactivations of the eleventh P-type thin film transistor T11 and the twelfth P-type thin film transistor T12 more effective for preventing the leakage. The rest working procedures are the same as the first embodiment. The repeated description is omitted here.

Figure 10:
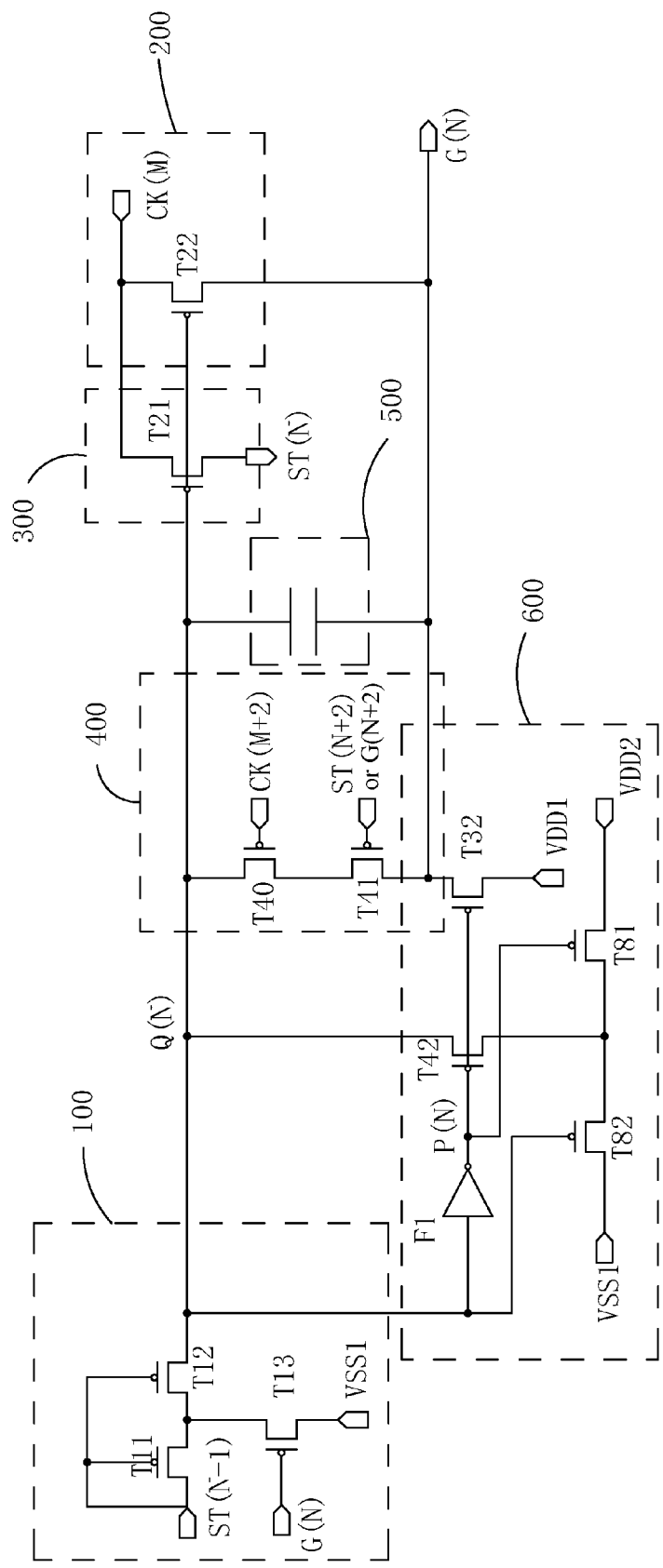
FIG. 10 is a circuit diagram of a PMOS gate driving circuit according to the sixth embodiment of the present invention.

Please refer to FIG. 10, which is a circuit diagram of a PMOS gate driving circuit according to the sixth embodiment of the present invention. The difference between the sixth embodiment and the fifth embodiment is that the received signals of the fortieth P-type thin film transistor T40 and the forty-first P-type thin film transistor T41 of the first pull-down module 400 are mutually switched. Namely, the gate of the fortieth P-type thin film transistor T40 is electrically coupled to the M+2th clock signal CK(M+2), and the gate of the forty-first P-type thin film transistor T41 is electrically coupled to the stage transfer signal ST(N+2) of the GOA unit circuit of the next second N+2th stage or the scan driving signal G(N+2) of the next second N+2th stage. Correspondingly, in the relationship of the first stage of the sixth embodiment according to the PMOS gate driving circuit of the present invention, the gate and the source of the eleventh P-type thin film transistor T11, and the gate of the twelfth P-type thin film transistor T12 are electrically coupled to a start signal STV, and in the relationships of the next stage to the last stage and the last stage, the gate of the forty-first P-type thin film transistor T41 is electrically coupled to a start signal STV. The others of the circuit structure and the working procedures are the same as those described in the fifth embodiment. The repeated explanation is omitted here.

Figure 11:
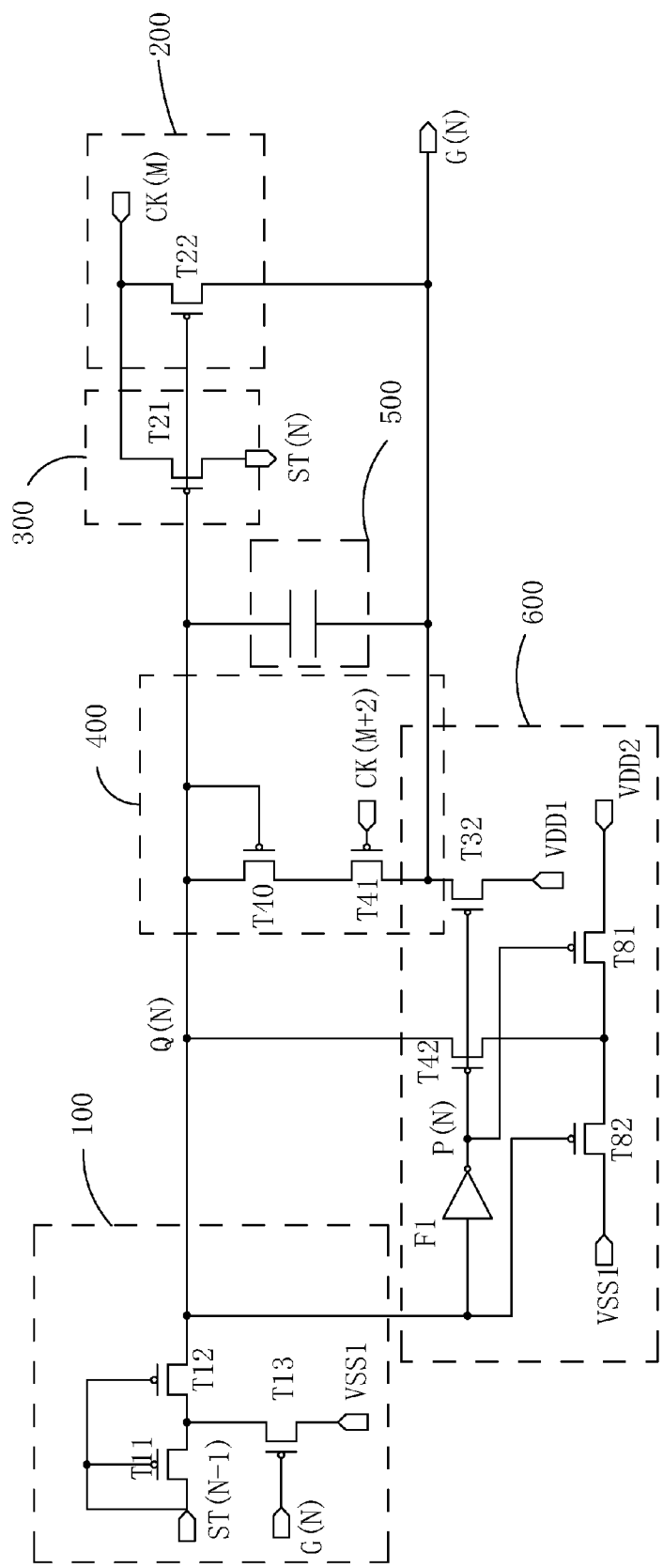
FIG. 11 is a circuit diagram of a PMOS gate driving circuit according to the seventh embodiment of the present invention.

Please refer to FIG. 11, which is a circuit diagram of a PMOS gate driving circuit according to the seventh embodiment of the present invention. The difference between the seventh embodiment and the fifth embodiment merely is that the fortieth P-type thin film transistor T40 of the first pull-down module 400 utilizes a diode-connection to reduce the leakage, i.e. both the gate and the source of the fortieth P-type thin film transistor T40 are electrically coupled to the first node Q(N), and the drain is electrically coupled to the source of the forty-first P-type thin film transistor T41; the gate of the forty-first P-type thin film transistor T41 is electrically coupled to the M+2th clock signal CK(M+2), and the source is electrically coupled to the drain of the fortieth P-type thin film transistor T40, and a drain is electrically coupled to the scan driving signal G(N). Correspondingly, in the relationship of the first stage of the seventh embodiment according to the PMOS gate driving circuit of the present invention, the gate and the source of the eleventh P-type thin film transistor T11, and the gate of the twelfth P-type thin film transistor T12 are electrically coupled to a start signal STV. The others of the circuit structure and the working procedures are the same as those described in the fifth embodiment. The repeated explanation is omitted here.

Figure 12:
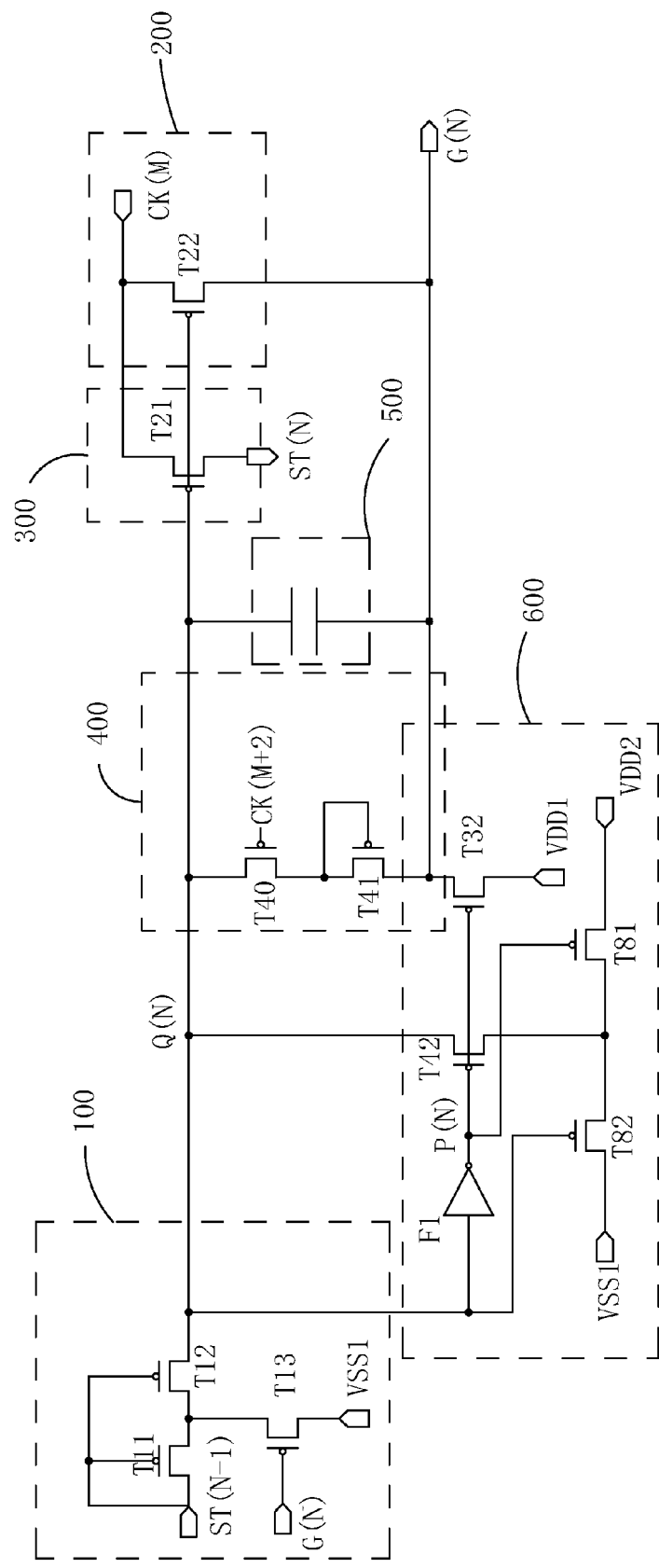
FIG. 12 is a circuit diagram of a PMOS gate driving circuit according to the eighth embodiment of the present invention.

Please refer to FIG. 12, which is a circuit diagram of a PMOS gate driving circuit according to the eighth embodiment of the present invention. The difference between the eighth embodiment and the fifth embodiment merely is that the forty-first P-type thin film transistor T41 of the first pull-down module 400 utilizes a diode-connection to reduce the leakage, i.e. both the gate and the source of the forty-first P-type thin film transistor T41 are electrically coupled to the drain of the fortieth P-type thin film transistor T40, and the drain is electrically coupled to the source of the scan driving signal G(N); the gate of the fortieth P-type thin film transistor T40 is electrically coupled to the M+2th clock signal CK(M+2), and the source is electrically coupled to the first node Q(N), and the drain is electrically coupled to the gate and the source of the forty-first P-type thin film transistor T41; correspondingly, in the relationship of the first stage of the eighth embodiment according to the PMOS gate driving circuit of the present invention, the gate and the source of the eleventh P-type thin film transistor T11, and the gate of the twelfth P-type thin film transistor T12 are electrically coupled to a start signal STV. The others of the circuit structure and the working procedures are the same as those described in the fifth embodiment. The repeated explanation is omitted here.

In conclusion, in the present invention provides a PMOS gate driving circuit, the pull-up controlling module receives a constant negative voltage level, which can reduce the influence of PMOS element leakage to the first node; the pull-down holding module is provided with a dual inverter comprising P-type thin film transistors, and utilizes special leakage prevention design, which can reduce the leakage of the first node to prevent the influence of the electrical property of the depletion-mode P-type thin film transistors to the output of the inverter, raise the stability of the gate driving circuit, and promote the integration of the panel. The frame width of the liquid crystal display panel can be decreased in advance, particularly to be suitable for small size panel which requires higher demands to the frame width.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A PMOS gate driving circuit, comprising a plurality of gate driver on array (GOA) unit circuits which are cascade connected, and the GOA unit circuit of every stage comprises a pull-up controlling module, a pull-up module, a transmission module, a first pull-down module, a bootstrap capacitor and a pull-down holding module;

N is set to be a positive integer, and in the GOA unit circuit of the Nth stage:

the pull-up controlling module is electrically coupled to a first node and the pull-down holding module; the pull-up controlling module at least comprises a P type thin film transistor, and at least receives a stage transfer signal of the GOA unit circuit of the former N−1th stage and a constant negative voltage level;

the pull-up module comprises: a twenty-second P-type thin film transistor, and a gate of the twenty-second P-type thin film transistor is electrically coupled to the first node, and a source is electrically coupled to an Mth clock signal, and a drain is electrically coupled to a scan driving signal;

the transmission module comprises: a twenty-first P-type thin film transistor, and a gate of the twenty-first P-type thin film transistor is electrically coupled to the first node, and a source is electrically coupled to the Mth clock signal, and a drain is electrically coupled to the stage transfer signal;

the first pull-down module is electrically coupled to the first node and the scan driving signal, and comprises a fortieth P-type thin film transistor and a forty-first P-type thin film transistor which are mutually cascade connected, and employed to pull up a voltage level of the first node to a voltage level of the scan driving signal in a non-functioning period;

one end of the bootstrap capacitor is electrically coupled to the first node, and the other end is electrically coupled to the scan driving signal;

the pull-down holding module comprises: an inverter comprising a plurality of P-type thin film transistor, and an input end of the inverter is electrically coupled to the first node, and an output end is electrically coupled to a second node; a thirty-second P-type thin film transistor, and a gate of the thirty-second P-type thin film transistor is electrically coupled to the second node, and a source is electrically coupled to a drain of the forty-first P-type thin film transistor, and a drain is electrically coupled to a first constant positive voltage level; a forty-second P-type thin film transistor, and a gate of the forty-second P-type thin film transistor is electrically coupled to the second node, and a drain is electrically coupled to the first node, and a source is electrically coupled to a drain of an eighty-second P-type thin film transistor; the eighty-second P-type thin film transistor, and a gate of the eighty-second P-type thin film transistor is electrically coupled to the first node, and a source is electrically coupled to the constant negative voltage level, and the drain is electrically coupled to a drain of an eighty-first P-type thin film transistor; the eighty-first P-type thin film transistor, and a gate of the eighty-first P-type thin film transistor is electrically couple to the second node, and a source is electrically couple to a second constant positive voltage level, and the drain is electrically couple to the drain of the eighty-second P-type thin film transistor;

the first constant positive voltage level is lower than the second constant positive voltage level.

2. The PMOS gate driving circuit according to claim 1, wherein the pull-up controlling module comprises one P-type thin film transistor: an eleventh P-type thin film transistor, and a gate of the eleventh P-type thin film transistor receives the stage transfer signal of the GOA unit circuit of the former N−1th stage, and a source receives the constant negative voltage level, and a drain is electrically coupled to the first node.

3. The PMOS gate driving circuit according to claim 1, wherein the pull-up controlling module comprises three P-type thin film transistors: an eleventh P-type thin film transistor, a twelfth P-type thin film transistor and a thirteenth P-type thin film transistor; both a gate and a source of the eleventh P-type thin film transistor receive the stage transfer signal of the GOA unit circuit of the former N−1th stage, and a drain is electrically coupled to a source of the twelfth P-type thin film transistor and a drain of the thirteenth P-type thin film transistor; a gate of the twelfth P-type thin film transistor receives the stage transfer signal of the GOA unit circuit of the former N−1th stage, and the source is electrically coupled to the drain of the eleventh P-type thin film transistor, and a drain is electrically coupled to the first node; a gate of the thirteenth P-type thin film transistor receives the scan driving signal, and a source receives the constant negative voltage level, and the drain is electrically coupled to the drain of the eleventh P-type thin film transistor.

4. The PMOS gate driving circuit according to claim 1, wherein a gate of the fortieth P-type thin film transistor is electrically coupled to a stage transfer signal of the GOA unit circuit of the next second N+2th stage or a scan driving signal of the next second N+2th stage, and a source is electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

5. The PMOS gate driving circuit according to claim 1, wherein a gate of the fortieth P-type thin film transistor is electrically coupled to an M+2th clock signal, and a source is electrically coupled to the first node, and a drain is electrically coupled to a source of the forty-first P-type thin film transistor; a gate of the forty-first P-type thin film transistor is electrically coupled to a stage transfer signal of the GOA unit circuit of the next second N+2th stage or a scan driving signal of the next second N+2th stage, and the source is electrically coupled to the drain of the fortieth P-type thin film transistor, and a drain is electrically coupled to the scan driving signal.

6. The PMOS gate driving circuit according to claim 1, wherein both a gate and a source of the fortieth P-type thin film transistor are electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

7. The PMOS gate driving circuit according to claim 1, wherein a gate of the fortieth P-type thin film transistor is electrically coupled to an M+2th clock signal, and a source is electrically coupled to the first node, and a drain is electrically coupled to a gate and a source of the forty-first P-type thin film transistor; both a gate and a source of the forty-first P-type thin film transistor are electrically coupled to the drain of the fortieth P-type thin film transistor, and a drain is electrically coupled to the scan driving signal.

8. The PMOS gate driving circuit according to claim 1, wherein the inverter comprises a fifty-second P-type thin film transistor, and a gate of the fifty-second P-type thin film transistor is electrically coupled to the first node, and a source is electrically coupled to a second constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to the second constant positive voltage level, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node.

9. The PMOS gate driving circuit according to claim 1, wherein the inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-second P-type thin film transistor and a gate of the sixty-fourth P-type thin film transistor is electrically coupled to the first node, and a source is electrically coupled to a second constant positive voltage level, and a drain is electrically coupled to a fifth node; a sixty-first P-type thin film transistor and both a gate and a source of the sixty-first P-type thin film transistor are electrically coupled to the constant negative voltage level, and a drain is electrically coupled to a fifth node; a sixty-fourth P-type thin film transistor and a gate of the sixty-fourth P-type thin film transistor is electrically coupled to the first node, and a source is electrically coupled to the second constant positive voltage level, and a drain is electrically coupled to the fourth node; a sixty-third P-type thin film transistor and a gate of the sixty-third P-type thin film transistor is electrically coupled to the fifth node, and a source is electrically coupled to the constant negative voltage level, and a drain is electrically coupled to the fourth node.

10. The PMOS gate driving circuit according to claim 1, wherein the inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-fourth P-type thin film transistor and a gate of the sixty-fourth P-type thin film transistor is electrically coupled to the first node, and a source is electrically coupled to a second constant positive voltage level, and a drain is electrically coupled to the fourth node; a sixty-third P-type thin film transistor and a gate of the sixty-third P-type thin film transistor is electrically coupled to the third node, and a source is electrically coupled to the constant negative voltage level, and a drain is electrically coupled to the fourth node.

11. A PMOS gate driving circuit, comprising a plurality of gate driver on array (GOA) unit circuits which are cascade connected, and the GOA unit circuit of every stage comprises a pull-up controlling module, a pull-up module, a transmission module, a first pull-down module, a bootstrap capacitor and a pull-down holding module;

N is set to be a positive integer, and in the GOA unit circuit of the Nth stage:

the pull-up controlling module is electrically coupled to a first node and the pull-down holding module; the pull-up controlling module at least comprises a P type thin film transistor, and at least receives a stage transfer signal of the GOA unit circuit of the former N−1th stage and a constant negative voltage level;

the pull-up module comprises: a twenty-second P-type thin film transistor, and a gate of the twenty-second P-type thin film transistor is electrically coupled to the first node, and a source is electrically coupled to an Mth clock signal, and a drain is electrically coupled to a scan driving signal;

the transmission module comprises: a twenty-first P-type thin film transistor, and a gate of the twenty-first P-type thin film transistor is electrically coupled to the first node, and a source is electrically coupled to the Mth clock signal, and a drain is electrically coupled to the stage transfer signal;

the first pull-down module is electrically coupled to the first node and the scan driving signal, and comprises a fortieth P-type thin film transistor and a forty-first P-type thin film transistor which are mutually cascade connected, and employed to pull up a voltage level of the first node to a voltage level of the scan driving signal in a non-functioning period;

one end of the bootstrap capacitor is electrically coupled to the first node, and the other end is electrically coupled to the scan driving signal;

the pull-down holding module comprises: an inverter comprising a plurality of P-type thin film transistor, and an input end of the inverter is electrically coupled to the first node, and an output end is electrically coupled to a second node; a thirty-second P-type thin film transistor, and a gate of the thirty-second P-type thin film transistor is electrically coupled to the second node, and a source is electrically coupled to a drain of the forty-first P-type thin film transistor, and a drain is electrically coupled to a first constant positive voltage level; a forty-second P-type thin film transistor, and a gate of the forty-second P-type thin film transistor is electrically coupled to the second node, and a drain is electrically coupled to the first node, and a source is electrically coupled to a drain of an eighty-second P-type thin film transistor; the eighty-second P-type thin film transistor, and a gate of the eighty-second P-type thin film transistor is electrically coupled to the first node, and a source is electrically coupled to the constant negative voltage level, and the drain is electrically coupled to a drain of an eighty-first P-type thin film transistor; the eighty-first P-type thin film transistor, and a gate of the eighty-first P-type thin film transistor is electrically couple to the second node, and a source is electrically couple to a second constant positive voltage level, and the drain is electrically couple to the drain of the eighty-second P-type thin film transistor;

the first constant positive voltage level is lower than the second constant positive voltage level;

wherein the pull-up controlling module comprises one P-type thin film transistor: an eleventh P-type thin film transistor, and a gate of the eleventh P-type thin film transistor receives the stage transfer signal of the GOA unit circuit of the former N−1th stage, and a source receives the constant negative voltage level, and a drain is electrically coupled to the first node;

wherein a gate of the fortieth P-type thin film transistor is electrically coupled to a stage transfer signal of the GOA unit circuit of the next second N+2th stage or a scan driving signal of the next second N+2th stage, and a source is electrically coupled to the first node, and a drain is electrically coupled to a source of the forty-first P-type thin film transistor; a gate of the forty-first P-type thin film transistor is electrically coupled to an M+2th clock signal, and the source is electrically coupled to the drain of the fortieth P-type thin film transistor, and a drain is electrically coupled to the scan driving signal.

12. The PMOS gate driving circuit according to claim 11, wherein the inverter comprises a fifty-second P-type thin film transistor, and a gate of the fifty-second P-type thin film transistor is electrically coupled to the first node, and a source is electrically coupled to a second constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to the second constant positive voltage level, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node.

13. The PMOS gate driving circuit according to claim 11, wherein the inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-second P-type thin film transistor and a gate of the sixty-fourth P-type thin film transistor is electrically coupled to the first node, and a source is electrically coupled to a second constant positive voltage level, and a drain is electrically coupled to a fifth node; a sixty-first P-type thin film transistor and both a gate and a source of the sixty-first P-type thin film transistor are electrically coupled to the constant negative voltage level, and a drain is electrically coupled to a fifth node; a sixty-fourth P-type thin film transistor and a gate of the sixty-fourth P-type thin film transistor is electrically coupled to the first node, and a source is electrically coupled to the second constant positive voltage level, and a drain is electrically coupled to the fourth node; a sixty-third P-type thin film transistor and a gate of the sixty-third P-type thin film transistor is electrically coupled to the fifth node, and a source is electrically coupled to the constant negative voltage level, and a drain is electrically coupled to the fourth node.

14. The PMOS gate driving circuit according to claim 11, wherein the inverter is a dual inverter, comprising a main inverter and an auxiliary inverter;

the main inverter comprises a fifty-second P-type thin film transistor, and a gate of the fifty-second P-type thin film transistor is electrically coupled to the first node, and a source is electrically coupled to a first constant positive voltage level, and a drain is electrically coupled to a third node; a fifty-first P-type thin film transistor, and both a gate and a source of the fifty-first P-type thin film transistor are electrically coupled to a constant negative voltage level, and a drain is electrically coupled to the third node; a fifty-fourth P-type thin film transistor, and a gate of the fifty-fourth P-type thin film transistor is electrically coupled to the first node, and a source is electrically coupled to a fourth node, and a drain is electrically coupled to the second node; a fifty-third P-type thin film transistor, and a gate of the fifty-third P-type thin film transistor is electrically coupled to the third node, and a source is electrically coupled to the constant negative voltage level, and a drain is electrically coupled to the second node;

the auxiliary inverter comprises a sixty-fourth P-type thin film transistor and a gate of the sixty-fourth P-type thin film transistor is electrically coupled to the first node, and a source is electrically coupled to a second constant positive voltage level, and a drain is electrically coupled to the fourth node; a sixty-third P-type thin film transistor and a gate of the sixty-third P-type thin film transistor is electrically coupled to the third node, and a source is electrically coupled to the constant negative voltage level, and a drain is electrically coupled to the fourth node.

* * * * *